(12) United States Patent
Lange et al.

(10) Patent No.: US 6,770,131 B2
(45) Date of Patent: Aug. 3, 2004

(54) III-V COMPOUND FILMS USING CHEMICAL DEPOSITION

(75) Inventors: Frederick F. Lange, Santa Barbara, CA (US); David Kisailus, Goleta, CA (US)

(73) Assignee: The Regents of the University of California, Oakland, CA (US)

(*) Notice: Subject to any disclaimer, the term of this patent is extended or adjusted under 35 U.S.C. 154(b) by 165 days.

(21) Appl. No.: 09/989,969

(22) Filed: Nov. 20, 2001

(65) Prior Publication Data

US 2003/0012874 A1 Jan. 16, 2003

Related U.S. Application Data

(60) Provisional application No. 60/252,260, filed on Nov. 20, 2000, and provisional application No. 60/305,249, filed on Jul. 12, 2001.

(51) Int. Cl.[7] .................................................. C30B 5/00
(52) U.S. Cl. ......................................................... 117/4
(58) Field of Search .......................... 117/89, 104, 952, 117/4; 252/67.36 A

(56) References Cited

U.S. PATENT DOCUMENTS

| | | | | |
|---|---|---|---|---|
| 4,975,299 A | * | 12/1990 | Mir et al. ...................... | 427/51 |
| 5,571,495 A | * | 11/1996 | Iijima et al. ................. | 423/598 |
| 6,001,284 A | * | 12/1999 | Enokida et al. ............. | 252/583 |
| 6,254,675 B1 | * | 7/2001 | Aldinger et al. ............. | 117/89 |
| 6,294,016 B1 | * | 9/2001 | Kim et al. .................... | 117/4 |

FOREIGN PATENT DOCUMENTS

EP          0 295 467 A          12/1988

OTHER PUBLICATIONS

Rodewald D et al: "Gan Derived From Carbodiimide–Based Polymer Precursors" Advanced Materials, VCH Verlagsgesellschaft, Weinheim, DE., vol. 11, No. 18, Dec. 17, 1999, pp. 1502–1504.

Cheng, F., Sugahara, Y., and Kuroda, K., *Chemistry Letters*, 2000, 138, "Preparation of A Soluble Precursor By An Aminolysis Reacion of Zr (NEt2)4".

Cheng, F., Sugahara, Y., and Kuroda, K., *Bull. Che. Soc. Jpn.*, 2000, 73, 1299, "Synthesis of A Soluble Precursor Possessing An Nb–N Backbone Structure and Its Pyrolytic Conversion Into Niobium–Based Ceramics".

Fiorentini, V., Bernardini, F., Bosin, A., Vanderbilt, D., in: M. Scheffler, R. Zimmermann (Eds.), Proceedings of the 23rd International Conference on Physics of Semiconductors, *World Scitific*, Singapore, 1996, p. 2877, "Ab Initio Shallow Acceptor Levels in Gallium Nitride".

(List continued on next page.)

*Primary Examiner*—Nadine G. Norton
*Assistant Examiner*—Matthew Anderson
(74) *Attorney, Agent, or Firm*—Fulbright & Jaworski

(57) ABSTRACT

A process for producing crystalline III-V compound films, preferably thin films of gallium nitride and other III-V nitrides, on various single crystal substrates. The process enables the preparation of III-V compound films by the simple, direct deposition of an amorphous layer of a III-V compound precursor on a single crystal substrate (as a template). A chemical reaction followed by a single heat treatment leads to the crystallization and formation of films by pyrolysis. According to specific examples of the invention, the chemical precursors gallium dimethyl amide $(Ga_2[N(CH_3)_2]_6)$, gallium nitrate $(Ga(NO_3)_3)$, and gallium isopropoxide $[Ga(OC_3H_7)_3$ are used to produce gallium nitride thin films.

22 Claims, 33 Drawing Sheets

OTHER PUBLICATIONS

Fix, R., Gordon, R.G. and Hoffman, D.M., *Chem Mater.*, 1990, 2, 235, "Synthesis of Thin Films by Atmospheric Pressure Chemical Vapor Deposition Using Amido and Imido Titanium (IV) Compounds as Precursors".

Fix, R., Gordon, R.G., and Hoffman, D.M., *Chem Mater,* 1991, 3, 1138, "Chemical Vapor Deposition of Titanium, Zirconium, and Hafnium Nitride Thin Films".

House, D.A., "Amonia and Amines", in *Comprehensive Coordination Chemistry. "The Synthesis, Reactions, Properties & Application of Coordination Compounds"*. Ed., Wilkinson, Sir Geoffrey, Pergammon Press, New York, 1987.

Janik, J.F. and Wells, R.L., *Chem. Mater.*, 1996, 8, 2708. "Gallium Imide, {Ga(NH) 3/2} n, a New Polymeric Precursor of Gallium Nitride Powders".

Leroux, M., et al., *Materials Science and Engineering*, 1997, B50, 97., "Luminescence and Reflectivity Studies of Undoped, n– and p–doped GaN on (0001) Sapphire".

L'vov, Boris V, *Theomochimica Acta*, 2000, 360, 85. "Kinetics and Mechanism of Thermal Decomposition of GaN".

Miller, K.T., Lange, F.F. and Marshall, D.B., *Journal Materials Research*, 1990, 5, 151, "The Instability of Polycrystalline Thin Films: Experiment and Theory".

Neumayer, D.A., and Ekerdt, J.G., *Chem. Mater,* 1996, 8, 9. "Growth of Group III Nitrides. A Review of Precursors and Techniques".

Noth, H. and Konrad, P., *Z. Naturfarsch,* 1975, 30b, 681 "Darstellung, Struktur und einige Reaktionen von Tris (dimethylamino) Gallan" ("Preparation, Structure and Some Reactionsol Trisdimethylaminogallane").

Okada, L.A., and George, S.M., *Applied Surface Science,* 1999, 137, 113, "Absorption and Desorption Kinetics of Tetrakis (dimethylamino) Titanium andDimethylamine on TiN".

Onitsuka, T., et al., *Journal Crystal Growth,* 1998, 189/190, 295, "Interface Structure of GaN on Sapphire (0001) Studied by Transmission Electron Microscope".

Panda, S., et al., *Thin Solid Films,* 1999, 357, 125, "Low Temperature Chemical Vapor Depositionof Titanium Nitride Films From Tetrakis (Ethylmethylamido) Titanium and Amonia".

Rodewald, D., et al., *Advanced Materials,* 1999, 11, 1502, "GaN Derived from Carbodiimide–Based Polymer Precursors".

Sun, Y.M. et al., *Materials Science in Semiconductor Processing,* 1999, 2, 253, "AluminumTitanium Nitride Films Grown With Multiple Precursors".

Strecker, A., Salzberger, U., and Mayer, J., *Prakt Metallogr.,* 1993, 30, 482, "Specimen Preparation for Transmission Electron Microscopy: Relliable Method for Cross–Sections and Brittle Materials".

Vande Walle, C.G., Stampfl, C., Neugebauer, *Journal of Crystal Growth,* 1998, 189/190, 505, "Theory of Doping andDefects In III–V Nitrides".

Weiller, B.H. and Partido, B.V., *Chem. Mater.,* 1994, 6, 260, "Flow–Tube Kinetics of Gas–Phase Chemical Vapor Deposition Reactions: TiN from Ti(NMe2)4 and NH 3".

Livage, J., Henry, M., and Sanchez, C., *Prog. Solid State Chem.,* 1988, 18, 259, "Sol–Gel Chemistry of Transmition Metal Oxides".

Brinker, C.J. and Scherer, G.W., *Sol–Gel Science,* Academic Press, New York, 1990, "The Physics and Chemistry of Sol–Gel Processing".

Chandler, C.D., Roger, C., and M.J. Hampden–Smith, *Chem. Rev.,* 1993, 93, 1205, "Chemical Aspects of Solution Routes to Perovskite–Phase Mixed–Metal Oxides from Metal–Organic Precursors".

Leroy, E., Robin–Brosse, C., and Torre, J.P., in *Ultrastructure Processing of Cermics, Glasses, and Composites,* Edited by L.L. Hench and Ulrich, D.R., Wiley–Interscience Publication, New York 1984, Chapter 18, "Fabrication of Zirconia Fibers from Sol–Gels".

Kim, J.H., and Lange, F.F., *Journal of Materials Research,* 1999, vol. 14, No. 10, 4004, "Epitaxial Growth of PbZr 0.5 Ti0.5O3 Thin Films on (001) LaAlO3 by the Chemical SolutionDeposition Method".

Langjahr, P.A., Wagner, T., Ruhle, M., and Lange, F.F., *Journal of Materials Research,* 1999, vol. 14, 2945, "Thermally Induced Structural Changes in Epitaxial SrZrO3 Films on SrTiO3".

Seifert, A., Lange, F.F., and Speck, J.S. , *Journal of Materials Research,* 1995, vol. 10, 680, "Epitaxial Growth of PbTiO3 Thim Films on (001) SrTiO3 from Solution Precursors".

Miller, K.T., Chan, C.I., Cain, M.G. , and Lange, F.F., *Journal of Materials Research,* 1993, vol. 8, 169, "Epitaxial Zirconia Thim Films from Aqueous Precursors".

Balkas, C.M., and Davis, R.E., *Journal of American Ceramic Society,* 1996, 79, 2309, "Synthesis Routes and Characterization of High–Purity, Single–Phase Gallium Nitride Powders".

Thompson, C.V., *Annu. Rev. Mater. Sci.,* 1990 20, 245, "Grain Growth in Thin Films".

Thompson, C.V., Floro, J. and Smith, H.I., *Journal of Applied Physics,* 67, (1990), "Epitaxial GrainGrowth in Thin Metal Films".

Miller, K.T. and Lange, F.F., *Journal of Materials Research,* vol. 6 (1991), p. 2387 "Highly Oriented Thin Films of Cubic Zirconia on Sapphire Through GrainGrowth Seeding".

Wells, R.L. and Gladfelter, W.L., *Journal of Cluster Science,* vol. 8 (1997), p. 217, "Pathways to Nanocrystalline III–V (13–15) Compound Semiconductors".

Waggoner, K.M., Olmstead, M.M. and Power, P.P., *Polyhedron,* vol. 9, (1990), p. 257, "Structural and Spectroscopic Characterization of the Compounds . . . ".

Puchinger, M., Wagner, T., Rodewald, D., Bill, J., Aldinger, F., and Lange, F.F., *Journal of Crystal Growth,* 208, (2000), p. 153, "Gallium Nitride Thin Layers Via a Liquid Precursor Route".

Puchinger, M., Wagner, T., Fini, P., Kisailus, D., Beck, U., Bill, J., Aldinger, F., Arzt, E. and Lange, F.F., *Journal of Crystal Growth,* 233, (2001), p. 57, "Chemical Solution Deposition Derived Buffer Layers for MOCVD–Growth GaN Films".

\* cited by examiner

GAN219
DK0009 200.0KV   83.0CM

GAN219
DK0003 200.0KV    83.0CM

GAN219
DK0011 200.0KV    83.0CM

III-V COMPOUND FILMS USING CHEMICAL DEPOSITION

CROSS REFERENCE TO RELATED APPLICATIONS

This application is based on U.S. Application Serial No. 60/252,260, filed Nov. 20, 2000; and Ser. No. 60/305,249, filed Jul. 12, 2001.

STATEMENT REGARDING FEDERALLY SPONSORED RESEARCH OR DEVELOPMENT

This invention was made with Government Support under Grant No. DMR9632716, awarded by the National Science Foundation. The Government has certain rights in this invention.

BACKGROUND OF THE INVENTION

1. Field of the Invention

The field of the invention relates generally to preparing III-V compound films.

2. Background

It is well known that III-V nitrides (InN, GaN, AlN, and their alloys) can be used for semiconducting applications such as Light Emitting Diodes ("LED's") and Laser Diodes ("LD's") in the blue to yellow range of the visible spectrum, UV photodetectors, and many other applications. These III-V nitrides are attractive because of their tunable bandgaps (1.9 eV, InN to 3.4 eV, GaN to 6.2 eV, AlN) and because of their chemical stabilities, resistance to radiation, and high thermal conductivity's. Neumayer et al.

Unfortunately, gallium nitride ("GaN") has a large equilibrium dissociation pressure of $N_2$ at its melting temperature and vapor growth temperatures. Thus, single crystals of GaN cannot be grown from the melt (liquid phase epitaxy, "LPE"). Instead, GaN single crystals are grown heteroepitaxially on single crystal substrates acting as heterogeneous nucleation sites.

Growth methods of highly crystalline, single crystal III-V materials, specifically GaN, focus on vapor transport processes. Such vapor processes include molecular beam epitaxy ("MBE") and metal organic chemical vapor deposition ("MOCVD"). Both processes involve the transport of gaseous species (atomic, ionic or molecular) to a heated single crystal substrate. The molecular or ionic species either crack and then adsorb onto the substrate surface or crack after they are adsorbed on the surface. After the species are adsorbed on the surface of the substrate, the heated substrate provides enough energy for their surface mobility. The species combine with the other element(s) and begin to form a layer of material. Depending on the surface energies of the film, interface and substrate, the material either grows layer by layer (Frank-van der Merwe), island coalescence (Volmer-Weber), or a modification of the two (Stranski-Krastanov). This growth of a single crystal material upon another is known as epitaxy.

Each vapor process has its limitations. The MOCVD process uses large quantities of ammonia in an attempt to keep a 1:1 ratio of group III element to nitrogen. Large quantities are necessary mainly due to (i) the large overpressure of nitrogen required to keep the GaN stable at high temperatures, and (ii) the poor cracking efficiency of ammonia into atomic nitrogen. Although the MBE process avoids the use of ammonia by producing atomic nitrogen from a RF plasma source, the process requires ultra high vacuum systems. Large quantities of ammonia, and ultra high vacuum levels, raise concerns about chemical safety and chemical disposal. Moreover, both MOCVD and MBD require large initial capital costs for equipment and maintenance.

A solution precursor route to form GaN thin films has been described in which GaN films are grown from a solution of gallium bis-(trimethylsilyl) carbodiimide. However, this precursor contains silicon and a strong nitrogen-carbon bond, and silicon and carbon impurities are left behind after pyrolysis and subsequent heat treatments. Rodewald et al. Silicon impurities in GaN have been known to act as unintentional shallow n-type dopants (increasing the electron carrier concentration) similar to oxygen impurities. Van de Walle et al. The silicon atom substitutes on the gallium site and has a low formation energy (<1 eV) such that it can be readily incorporated into GaN. This has a negative effect when trying to produce LD's, since p-type GaN can not be grown using this method. Carbon impurities are theoretically expected to act as deep acceptor states. However, experiments have shown that carbon impurities act as shallow donors in GaN. Fiorentini et al.; Leroux et al. The silicon and carbon impurities cause a broad yellow emission in the photoluminescence ("PL") spectrum. Thus, the carbodiimide precursor is unsuitable for its intended electronic device applications.

For the foregoing reasons, there is a need for a process of producing III-V compound films that uses smaller volumes of ammonia and lower pressure levels, and that gives films without silicon or carbon impurities.

SUMMARY OF THE INVENTION

The present invention is directed to a process that satisfies the needs for smaller volumes of ammonia, lower pressure levels, and insignificant levels of silicon and carbon impurities. The new process for producing crystalline III-V compound films on crystal substrates comprises depositing an amorphous layer of a III-V compound precursor on a crystal substrate, reacting the amorphous layer with a reduced form of a Group V element, and then heating the amorphous layer at a temperature and for a time sufficient to crystallize the amorphous layer by pyrolysis. Preferably, the III-V compound precursor is deposited by coating a single crystal substrate with a solution of the precursor. Moreover, in the presence of ammonia and using suitable oxygen-containing precursors, the reacting and heating steps can be carried out simultaneously.

According to one version of the invention, III-V thin films are produced on single crystal substrates using the II-V compound precursor exemplified by gallium dimethyl amide $(Ga_2[N(CH_3)_2]_6;$ "GDA"). This precursor contains gallium-nitrogen bonds which minimize the required amount of ammonia. An amorphous layer of the precursor is deposited by spin coating or dip coating a solution of GDA on a single crystal substrate, the amorphous layer is reacted with ammonia at room temperature to remove carbon groups from the precursor, and then the amorphous layer is heated in either nitrogen or ammonia to crystallize the amorphous layer by pyrolysis. The single crystal substrate, which has a similar crystalline structure to GaN, acts as a nucleation site. The film grows into a single crystal GaN layer at higher temperatures. This version on the invention is both simple and inexpensive (both capital and operating costs), and is carried out at atmospheric conditions, negating the need for costly high vacuum systems. Films of other III-V nitrides can be produced using the corresponding Group III–dimethyl amide.

According to another version of the invention, GaN thin films are produced on single crystal substrates using oxygen-containing, III-V compound precursors exemplified by either a gallium salt, gallium nitrate [$Ga(NO_3)_3$] ("GNO"), or an alkoxide of gallium, gallium isopropoxide [$Ga(OC_3H_7)_3$] ("GIP"). These precursors are oxygen-containing molecules that are stable in air. An amorphous layer is deposited on a single crystal substrate by spin or dip coating a solution of GNO or GIP on a single crystal substrate, and the amorphous oxide layer is heated in ammonia to nitride the oxide layer and to remove carbon. The heating step also crystallizes the amorphous layer. This version of the invention is carried out under atmospheric conditions, negating the need for costly high vacuum systems. Other III-V nitride films can be produced using the corresponding Group III salt or alkoxide.

The operating frequency of devices made from films produced by this invention can be changed since aluminum and indium may be easily added to the precursor solution in exact amounts while p-dopants such as magnesium or n-dopants such as silicon may be added. These films can also be used as free standing entities or as buffer layers for CVD overgrowth in order to lower defect densities and improve overall efficiency of LED and LD devices. A significant advantage of this invention is its dramatic cost effectiveness versus conventional vapor processes.

The novel features which are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

DETAILED DESCRIPTION OF THE INVENTION

General Description

Figure 1:
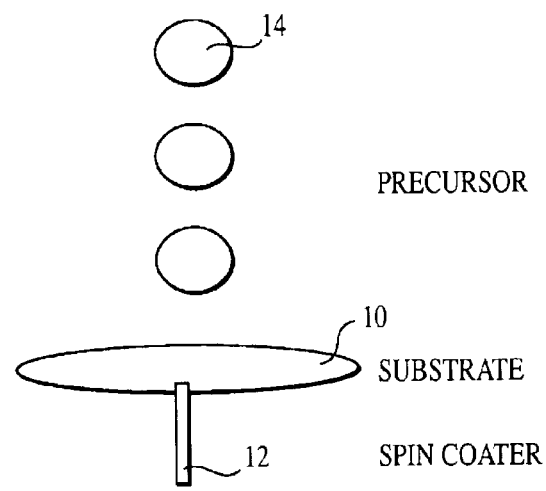
FIG. 1 schematically shows film preparation and deposition.
Figure 1:
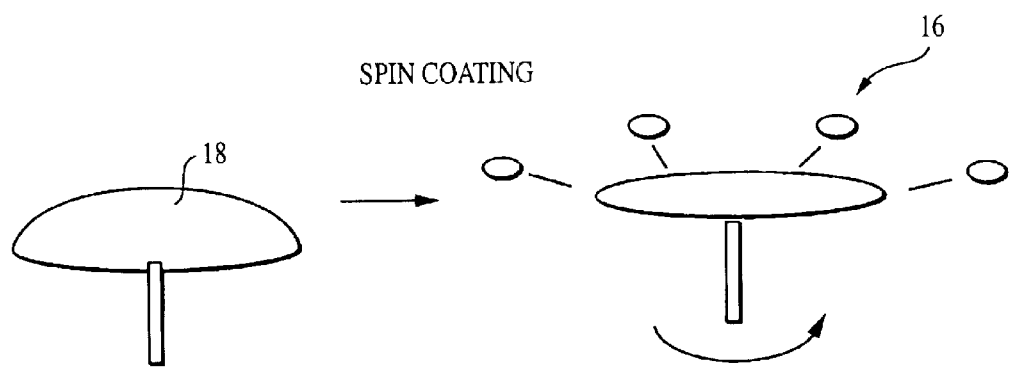

This invention is a new process for producing crystalline III-V compound films on crystal substrates. The process comprises the following steps: (1) depositing an amorphous layer of a III-V compound precursor on a crystal substrate, (2) reacting the amorphous layer with a reduced form of a Group V element; and then (3) heating the amorphous layer at a temperature and for a time sufficient to crystallize the amorphous layer by pyrolysis.

In the depositing step, suitable III-V compound precursors are basically those containing the Group III ion, for example Al, Ga, In, or B, along with any ligand group attached to the Group III ion. Suitable Group V elements are N, P, As, or SB. Preferred III-V compound precursors are those which can be dissolved in aqueous or non-aqueous solvents such as water or water-based solvents (acids and bases), aromatics (e.g., benzene, toluene), alkanes (e.g., dodecane) and cycloalkanes, alcohols (e.g., isopropanol), ethers (e.g., diallyl ether), alkynes, alkenes, and other organic solvents.

Particularly suitable III-V compound precursors are III-V nitride precursors such as Group III-dimethyl amides (Group III)$_2$[N(CH$_3$)$_2$]$_6$, oxygen and non-oxygen-based Group III salts such as Ga(NO$_3$)$_3$, gallium carboxylates, gallium halides, such as GaCl$_3$, and Group III alkoxides, such as Ga(OC$_x$H$_{2x+1}$)$_3$.

Preferred Group III dimethyl amides are Ga$_x$Al$_y$In$_z$)$_2$[N(CH$_3$)$_2$]$_6$, where x, y, and z are from 0 to 1 and x+y+z=1.

Preferred oxygen-containing Group III salts are Ga$_x$Al$_y$In$_z$)(NO$_3$)$_3$, where x, y, and z are from 0 to 1 and x+y+z=1.

Preferred Group III alkoxides are Ga$_x$Al$_y$In$_z$)(OC$_x$H$_{2x+1}$)$_3$ where x, y, and z are from 0 to 1 and x+y+z=1.

Particularly suitable III-V nitride precursors are GaN precursors. Suitable inorganic GaN precursors include salts, for example, gallium nitrate, gallium sulfate, gallium oxide, gallium hydroxide, gallium phosphide, gallium nitride, gallium sulfide, gallium selenide, sodium gallate, calcium gallate, gallium antimonide, or gallium compounds that have the empirical formula GaM(SO$_4$)$_2$, where M is NH$_4^+$ or a member of Group IA of the periodic table, as found at page 83 of the Handbook of Chemistry and Physics, 54th edition (1973–74), published by the Chemical Rubber Company Press, Cleveland, Ohio. Less preferred, because of the corrosive effect of halogens on process equipment, are halogen-containing gallium salts, for example, GX$_3$ or Ga(XO$_3$)$_3$, where X is selected from the group Cl, Br and I. Suitable organic compounds can be represented generally by the formula GaR$_3$ wherein R is an organic moiety. Included within this group are the salts of carboxylic acids, (R'COO)$_3$Ga wherein R' is hydrogen or a hydrocarbyl radical having from 1 to about 20 carbon atoms. Examples of suitable carboxyl compounds include gallium formate, gallium acetate, gallium propionate, gallium butyrate, gallium decanoate, gallium stearate, gallium citrate, gallium lactate, gallium malate, gallium oxalate, and the like. Polybasic carboxylates, such as gallium citrate, gallium malonate, and gallium oxalate can also be utilized. Other suitable organic compounds are for example, gallium tris(hydrocarbyl oxide)s—Ga(OR")$_3$— wherein R" preferably contains one to about 20 carbon atoms and can be an alkyl, alkenyl, cycloalkyl, or aryl radical, or a combination of radicals such as alkaryl, aralkyl, alkylcycloalkyl, and the like. Examples of suitable oxyhydrocarbyl compounds are gallium methoxide, gallium isopropoxide, gallium tert-butoxide, gallium phenoxide, gallium decyloxide, and the like. Other suitable organic compounds are for example, gallium alkyls-GaR'"$_3$— where R'" can be an alkyl group containing 1–20 carbon atoms, preferably 1–5 carbon atoms. Examples of suitable hydrocarbyl compounds are triethylgallium, tributylgallium, diethylpentylgallium, and the like. It is recognized that these compounds are pyrophoric and must be treated accordingly. R', R", and R'" can be substituted with, for example, halogen, sulfur, phosphorus or nitrogen. For example, sulfur containing compounds such as gallium dialkyldithiocarbamates and gallium xanthates are suitable. Also, gallium compounds containing both phosphorus and sulfur, for example, gallium dihydrocarbyl dithiophosphates, such as those represented by the formula Ga[S$_2$ P(OR'")$_2$]$_3$ wherein R'" is as defined before, are suitable.

Preferred GaN precursors include gallium dimethyl amide, gallium nitrate [Ga(NO$_3$)$_3$] and gallium isopropoxide [Ga(OC$_3$H$_7$)$_3$].

Suitable crystal substrates are basically any desired substrates which can withstand the temperatures prevailing during the heating step. It is advantageous to use substrates which have similar coefficients of thermal expansion to cubic or hexagonal GaN. Preference is given to substrates comprising elements from main groups III to VI and subgroups IV to VI of the Periodic Table of the Elements or compounds containing such elements. Preferred examples of substrates are elements or compounds having metallic or semiconducting properties, for example Si and GaAs. Further preferred examples are substrates having graphite surfaces or ceramic surfaces, for example SiC, Al$_2$O$_3$, Si$_3$N$_4$, TiC or TiN. The particularly preferred substrate is $\alpha$-Al$_2$O$_3$, in particular $\alpha$-Al$_2$O$_3$—C.

Particularly suitable substrates for the deposition of heteroepitactic $\alpha$-GaN are $\alpha$-Al$_2$O$_3$ (0001), $\alpha$-Al$_2$O$_3$ (01–12), $\alpha$-Al$_2$O$_3$ (11–20), $\alpha$-Al$_2$O$_3$ (10—10), 6g—SiC (0001), (100) LiAlO$_2$, (001) LiGaO$_2$ (111) NdGaO$_3$. For cubic GaN ($\beta$-GaN), GaAs (001) as well as Si (001) and Si (111) substrates are of particular importance.

Preferably, the precursor is deposited by spin coating, dip coating or spraying.

In the reacting step, suitable reduced forms of Group V elements are, PH$_2$, PH, P, AsH$_2$, AsH, As, SbH$_2$, SbH, Sb, NH$_2$, NH, and N. Particularly suitable are any NH$_x$ groups, where x is 0 to 2.

The reacting and heating steps can be carried out simultaneously. Suitable conditions include reacting and heating the amorphous layer in ammonia. Suitable III-V compound precursors include oxygen-containing Group III salts, preferably oxygen-containing gallium salts such as gallium nitrate Ga(NO$_3$)$_3$ or gallium acetate Ga(OCOCH$_3$)$_3$, and Group III alkoxides, preferably gallium alkoxides such as gallium isopropoxide (Ga(OC$_3$H$_7$)$_3$) or gallium ethoxide (Ga(OC$_2$H$_5$)$_3$).

The operating frequency of devices made from films produced by this invention can be changed since aluminum and indium may be easily added to the precursor solution in exact amounts while p-dopants such as magnesium or n-dopants such as silicon may be added. These films can also be used as free standing entities or as buffer layers for CVD overgrowth in order to lower defect densities and improve overall efficiency of LED and LD devices. A significant advantage of this invention is its dramatic cost effectiveness versus conventional vapor processes.

SPECIFIC EXAMPLES

Production of GaN Thin Films

Epitaxial Growth from Amorphous and Polycrystalline Films

Miller and Lange grew single crystal thin films from the binary ZrO$_2$—Y$_2$O$_3$ system on single crystal ZrO$_2$ (9.5 mole % Y$_2$O$_3$) substrates. Miller and Lange. In these experiments, a mixed precursor of zirconium acetate/yttrium nitrate was deposited on the single crystal substrate and decomposed to form a low density, polycrystalline thin film by heating to ~450° C. Thin films were then heat treated to promote epitaxial growth. Preliminary evidence suggested that nanocrystallites (<20 nm) which are touching the substrate had the same orientation as the substrate at temperatures as low as 500° C. At 900° C., a large fraction of the film is dense and had the same orientation as the substrate. The film also had polycrystalline regions furthest from the interface and contained porosity in that region. By 1100° C., the initial epitaxial grains had consumed the polycrystalline layer to form a fully dense epitaxial film. The conclusion is that the film had grown by grain boundary motion. If the substrate has a similar structure to the film or if the lattice parameters of film and substrate are similar, the film can nucleate on the substrate due to a lowering of the overall surface energy (2 surface energies to 1 interfacial energy)

General Methods

1. Substrate Preparation

C-plane (0001) $Al_2O_3$, r-plane (01–12) $Al_2O_3$, (001) $LiGaO_2$, and (100) $LiAlO_2$ single crystal substrates (MTI Corporation, Richmond, Calif.) are used as templates for GaN growth. Prior to growth, the substrates are soaked in a series of solvents: isopropanol, acetone, trichloroethylene, isopropanol, and deionized water. In some cases, a cotton swab dipped in the appropriate solvent is used to mechanically removal contaminants. After a deionized water rinse, the samples are then dried in a stream of dry nitrogen and transferred immediately to an alumina tube furnace for heat treatment in air. Sapphire substrates are annealed in air at 1300° C. for 1 hour while the $LiGaO_2$ and $LiAlO_2$ substrates are annealed in air at 800° C. for 1 hour. The $LiGaO_2$ and $LiAlO_2$ substrates are immediately transferred to a glove box for coating. Prior to coating, the sapphire substrates are immersed in a heated solution (80° C.) of concentrated $H_2SO_4$+30 wt % $H_2O_2$ (3:1 by volume) for 30 minutes. The substrates are then rinsed with deionized water, dried in a stream of dry nitrogen, and transferred to the glove box to be coated.

2. Film Deposition

Referring to FIG. 1, thin films are prepared in a glove box or dust hood by placing a clean substrate 10 (5 mm×5 mm or 10 mm×10 mm), as previously described, on the spin coater (Model KW-4A, Chemat Technology, Northridge, Calif.) chuck 12 held down by either vacuum or a piece of double sided tape. A few drops 14 of precursor solution are pipetted on the substrate (enough to cover the substrate surface). As shown, the excess liquid 16 is removed from the surface 18 by rotating the substrate at high speeds (between 2000–7000 rpm). Due to the surface tension between the precursor solution and the substrate, a thin film of precursor remains on the surface of the substrate.

Alternatively, thin films can be prepared by dip coating. Preferably, the substrate is immersed in the precursor solution, then removed at a uniform, defined rate so as to uniformly coat the substrate with precursor solution except for the lower edge. Thin films can also be prepared by spray coating, where the precursor solution is atomized and the substrate is held in the spray cone or spray mist. The precursor can also be applied by spreading, for example with a brush.

Production of GaN Thin Films Using GDA.

1. Method

This version of the invention uses the chemical precursor gallium dimethyl amide $(Ga_2[N(CH_3)_2]_6$; "GDA") which contains gallium-nitrogen bonds, is non-volatile at ambient conditions, and is soluble in most nonpolar organic solvents. An amorphous film is deposited by spin coating a solution of GDA on a single crystal substrate. The film undergoes a transamination reaction at room temperature with ammonia and is subsequently pyrolyzed and crystallized in either ammonia or nitrogen to form a heteroepitaxial, single crystal GaN film.

The use of GDA avoids high volumes of ammonia (as in MOCVD routes) as well as ultra high vacuum systems (as in MBE). The capital costs for producing films are orders of magnitude less than those used by vapor routes. $LiGaO_2$ and $LiAlO_2$ substrates, which have a much better lattice match with GaN but cannot be used in MOCVD reactions due to the instability and reactivity in ammonia, can be used as substrates when practicing a chemical solution deposition route to GaN because films can be grown at high temperatures in nitrogen gas. Kisailus and Lange.

The process using GDA is described below in the following steps: (A) substrate preparation, (B) solution preparation, (C) film deposition, (D) reaction of precursor with ammonia, (E) pyrolysis and crystallization of GaN.

A. Substrate preparation. C-plane (0001) $Al_2O_3$, r-plane (01–12) $Al_2O_3$, (001) $LiGaO_2$, and (100) $LiAlO_2$ single crystal substrates were prepared as described above.

Another substrate is r-plane $Al_2O_3$.

Figure 2:
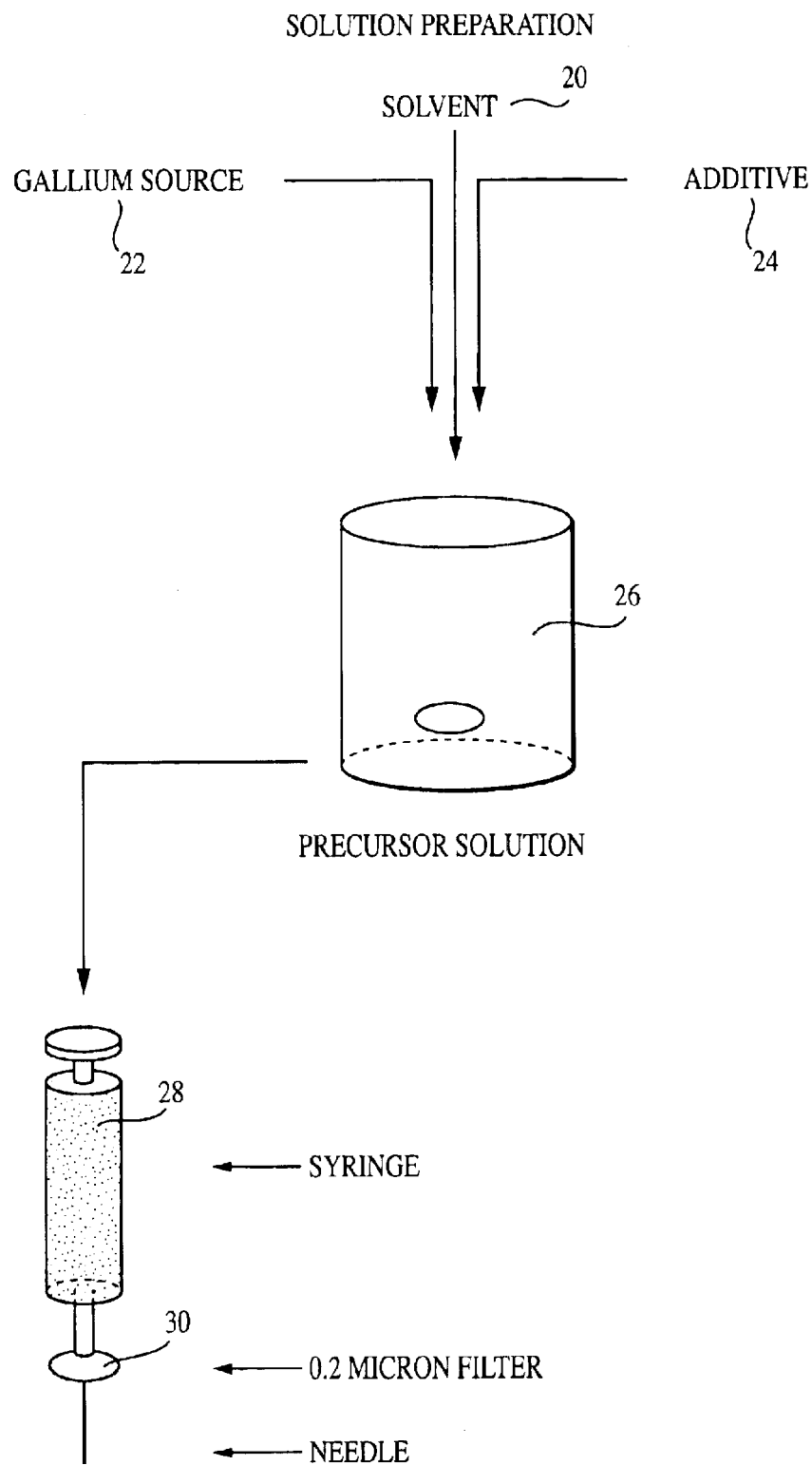
FIG. 2 schematically shows the preparation of GaN precursor solutions.

B. Solution Preparation. All preparations of solutions are done in a dry nitrogen glove box (Model HE-493, Vacuum Atmospheres Company, Hawthorne, Calif.) due to concerns about oxygen and moisture sensitivity of the precursor. Toluene (or o-xylene), used for the solution preparation, is dried by refluxing over sodium metal and benzophenone. Several freeze, pump, and thaw cycles removed absorbed gases from solvents. Gallium Dimethyl Amide, GDA (99.9% (metal basis) from Alfa Aesar (a Johnson-Matthey subsidiary, Ward Hill, Mass.) is weighed out to desired amounts. Alternatively, GDA can be synthesized by a metathesis reaction between $GaCl_3$ and LiN $(CH_3)_2$ which yields an amorphous powder of $Ga_2[N(CH_3)_2]_6$. North and Kazad. Referring to FIG. 2, solutions are prepared by adding a measured volume of anhydrous toluene solvent 20 to an appropriate amount of GDA as the gallium source 22. to achieve the desired precursor solution 26 concentration. In the aqueous solution preparations, a small amount of polyvinyl alcohol 24 can be added to the gallium salt to increase solution viscosity. Concentrations are varied between 0.05M–0.40M, however, 0.2M is commonly used. Because the GDA dissolved readily in toluene, gentle shaking is adequate to ensure proper mixing of solutions. Solutions are dispersed from a syringe 28 through a 0.2 μm Teflon filter 30 (Whatman Inc., Clifton, N.J.) into a clean vial. The vial is capped, sealed with parafilm (American National Can, Menasha, Wis.), and stored in the glove box.

C. Film Deposition. Thin films of GDA were deposited by spin coating, as described above.

Figure 3A:
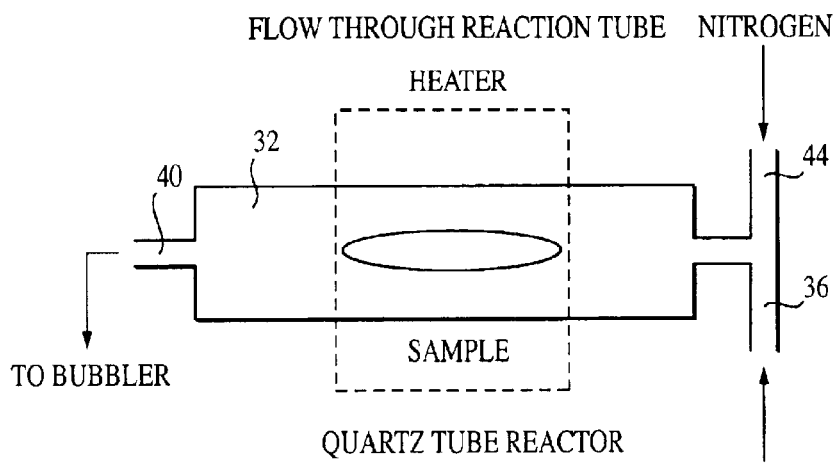
FIGS. 3A and B schematically shows two different reactor geometries and set ups.
Figure 3B:
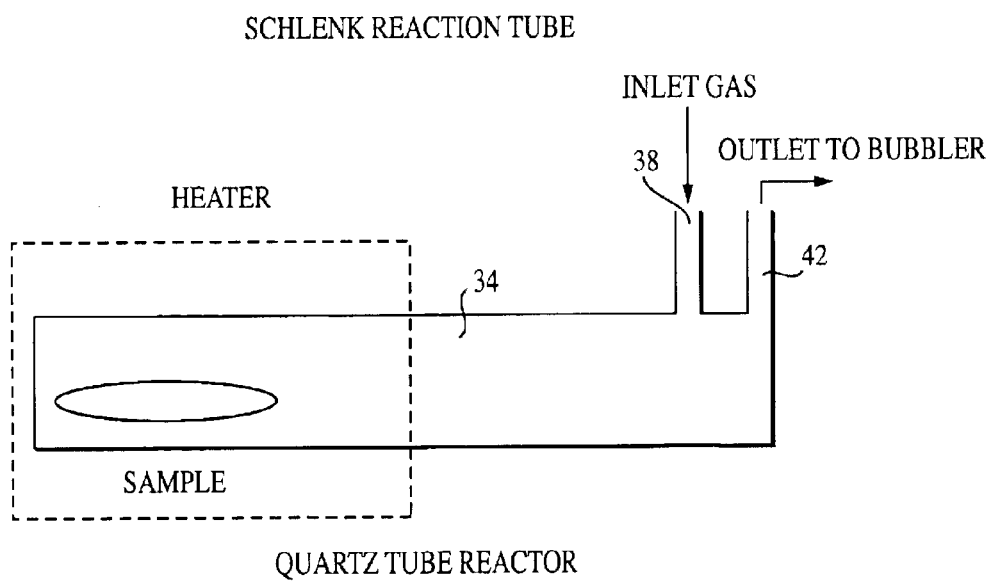

D. Reaction with Ammonia (see FIGS. 3A and B). After the precursor solution was deposited on the substrate surface, the film/substrate was transferred into a quartz reactor tube—either a flow through tube 32 (FIG. 3A) or Schlenk Reaction tube 34 (FIG. 3B). The valves on the tube were sealed and the tube removed from the glove box. An ammonia line was attached to the quartz tube inlet valve, the inlet valve being shown at 36 in FIG. 3A and at 38 in FIG. 3B. 99.99% of anhydrous ammonia was flowing through the line when attached to the valve fitting in order to reduce oxygen contamination. The exit fitting was attached to a separate tube (40 in FIG. 3A, 42 in FIG. 3B) with the opposite end connected to a mineral oil bubbler. The inlet valve was opened followed by the exit valve, and the ammonia gas was allowed to pass over the film inside the tube. The ammonia flow rate was set at 50 cc/minute throughout the entire process, unless $N_2$ gas was used as the gas during heat treatments. The ammonia was passed through the tube for 1 hour to ensure a complete reaction with the GDA.

E. Pyrolysis and Crystallization of GaN (see FIGS. 3A and B). After the reaction between the ammonia gas and GDA, one of two steps followed: (i) The ammonia was turned off and evacuated from the reaction tube or; (ii) ammonia was flowed through the reaction tube at a rate of 50 cc/minute. In the first situation, nitrogen gas was used to refill the reaction tube, through inlet 44 in FIG. 3A or through inlet 38 in FIG. 3B. The tube was then evacuated again. This process was repeated five more times to ensure complete removal of the ammonia gas from the reactor tube. Nitrogen gas flowed through the reactor tube at a rate of 50 cc/minute.

Regardless of whether pyrolysis step E(i) or E(ii) was taken, the tube was heated in a clamshell style furnace (Model 55035, Lindberg, Watertown, Wis.) at a rate of 5° C./minute to temperatures between 900° C. and 1100° C. in order to pyrolyze and crystallize the film. The peak temperature was held for 0.5–1.0 hour followed by a cooling rate of −5° C./minute. After cooling, the tube was flushed with nitrogen gas and the sample was removed for subsequent analysis.

2 Results

A. Analysis of GDA—$NH_3$ Reaction

Ammonia is an amine with hydrogen atoms substituting for carbon groups regularly seen on amines. Because there are no carbon groups (which are electron donating to the nitrogen atom) in ammonia, its basicity is less than a primary or secondary amine with carbon groups. In fact it is reported that the "proton affinity", which can be thought of as the enthalpy of the reaction, Eqn. (1), of ammonia, $$B+H^+ \rightarrow BH^+ \quad (1)$$

is less (870 kJ/mole) than that of dimethyl amine (942 kJ/mole); House. Also, the nitrogen atom in ammonia is more "exposed" than carbon containing amines. This makes bonding, between the ammonia and the gallium atom more possible and will result in a more stable covalent bond between the nitrogen and gallium atom. Thus, it is expected that when ammonia reacts with GDA (which has carbon containing secondary amine groups, dimethyl amine), it penetrates to the electron shell of the gallium, atom and forms a four-center transition state between (1) the gallium atom, (2) the nitrogen atom of the ammonia, (3) a hydrogen atom of ammonia, and (4) the nitrogen atom of the dimethyl amine. The bonds between (1)–(4), and (2)–(3) break while now covalent bonds form between (1)–(2) and (3)–(4), Eqn. (2). The dimethyl amine radicals are released with an exchange of a hydrogen atom, Eqn. (3):

$$Ga-N(CH_3)_2 + NH_3 - Ga-NH_2-H \cdot N(CH_3)_2 \quad (2)$$

$$Ga-NH_2-H+\cdot N(CH_3)_2 \rightarrow Ga-NH_2+HN(CH_3)_2 \quad (3)$$

The overall reaction of GDA with ammonia is expected to behave similarly, Eqn. (4):

$$Ga_2[N(CH_3)_2]_6 + 6NH_3 \rightarrow Ga_2[NH_2]_6 + 6HN(CH_3)_2 \quad (4)$$

Figure 4:
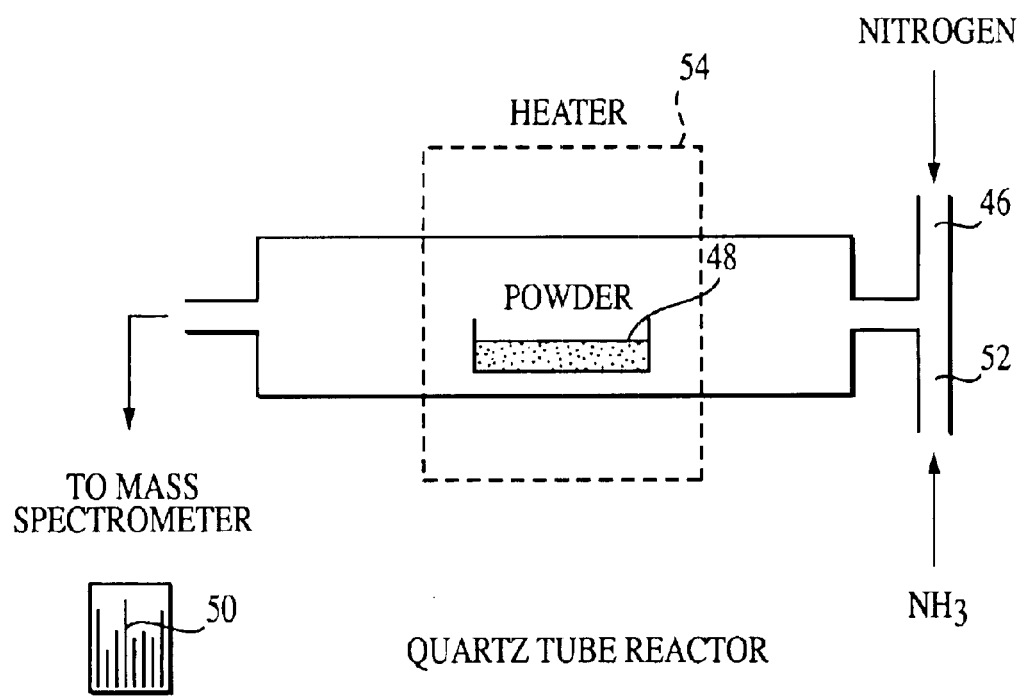
FIG. 4 schematically shows the mass spectrometer set up to determine the reaction between precursor and ammonia.

An experiment was designed to test these reactions. Within a glove box, GDA was placed in a small alumina boat. The boat was loaded into a flow through quartz tube similar to the one in FIG. 3A. The ends of the tube were sealed and the tube was removed from the glove box. The inlet of the tube was attached to a gas line (for ammonia or nitrogen gas) while the outlet tube was directed into a mass spectrometer (Model 5890, Hewlett Packard Co., North Hollywood, Calif.). The experimental setup is shown in FIG. 4. At room temperature, nitrogen gas was passed through tube 46 over the GDA powder 48 and into a mass spectrometer 50 where it was sampled 2 minutes after flow had started. Next, with the flowing nitrogen, the ammonia gas was flowed through tube 52. Another sample was then taken of the outlet gas. Finally, a third experiment was run with fresh, unreacted GDA powder, in which the inlet nitrogen gas was sent through a bubbler of water and into the tube. No ammonia was used for this third experiment. A sample was taken by the mass spectrometer approximately 2 minutes after the flow had begun. Table 1 shows the results of the 3 experiments.

TABLE 1

Mass Spectrometer Analysis of GDA Reaction

| Inlet Gases | Molecular Wt. Detected | Products |
|---|---|---|
| $N_2$ | 14 | None |
| $N_2$, $NH_3$ | 14,17,45 | $HN(CH_3)_2$ |
| $N_2$, $N_2O$ | 14,18,45 | $HN(CH_3)_2$ |

As seen in Table 1, both ammonia and water react with the GDA to form some product (probably a gallium diimide or gallium hydroxide, respectively) plus dimethyl amine. It is reasonable to consider that water acts similarly as ammonia in this reaction based on the size of the molecules, their electronegativities and functionality as bases.

A second experiment was done to confirm the products of the reaction shown in Eqn. (4). Weight loss measurements were taken of GDA before and after exposure to ammonia. In a glove box, a specific amount of GDA was weighed into a preweighed alumina boat. The GDA in the boat was placed in a quartz tube reactor, similar to the one shown in FIG. 3B. The reactor was sealed and removed from the box. Ammonia gas flowed over the powder at room temperature for 1 hour. The ammonia was then disconnected and evacuated from the reactor tube. The tube was reintroduced into the box and the powder was reweighed. This experiment was independently performed 3 times with the results shown in Table 2.

TABLE 2

Weight Loss Study of GDA in $NH_3$

| Experiment # | Initial Wt. | Final Wt. | % Wt. Remaining |
|---|---|---|---|
| 1 | 0.0969 | 0.0468 | 48.30 |
| 2 | 0.0716 | 0.0364 | 50.84 |
| 3 | 0.1511 | 0.0809 | 53.54 |

The average weight percent remaining after the reaction with GDA and ammonia is 50.89%. The result is not expected based on the reaction shown in equation 4. If it was, there would be 58.36 weight percent remaining. It is possible that the final product is a 3-coordinated gallium atom rather than the 4-coordinated one in the GDA. Equation (5) shows a possible reaction product.

$$Ga_2[N(CH_3)_2]_6 + 6NH_3 \rightarrow Ga_2[NH_2]_4 + 6HN(CH_3)_2 + 2 \cdot NH_2 \quad (5)$$

It is also possible that the product is in the form of a polymer as suggested by Okada, who studied titanium-based amides. Equation 6 shows this possible reaction; see Okada and George.

$$(Ga_2[N(CH_3)_2]_6 + 3/2NH_3 \rightarrow 1/n \ (Ga_2[NH_{3/2}]_n + 3HN(CH_3)_2 \quad (6)$$

The reaction is valid and if 6 GDA units combine (hexamer with Ga [$NH$]$_2$Ga being the repeating unit), the weight percent retained from GDA powder to this hexamer would be 50.84%. This is within reasonable limits to the experimental results seen in table 2. Also, the gallium atom would retain its 4-coordinate structure.

Finally, upon heat treatment in ammonia or nitrogen, as shown by heater 54 in FIG. 4, either product of Eqn. (5) or (6) would form GaN upon release of ammonia, Eqn. (7).

$$1/n \ (Ga[NH]_{3/2})n \rightarrow GaN + 1/2NH_3 \quad (7)$$

B. Film Analysis and Characterization

Figure 5A:
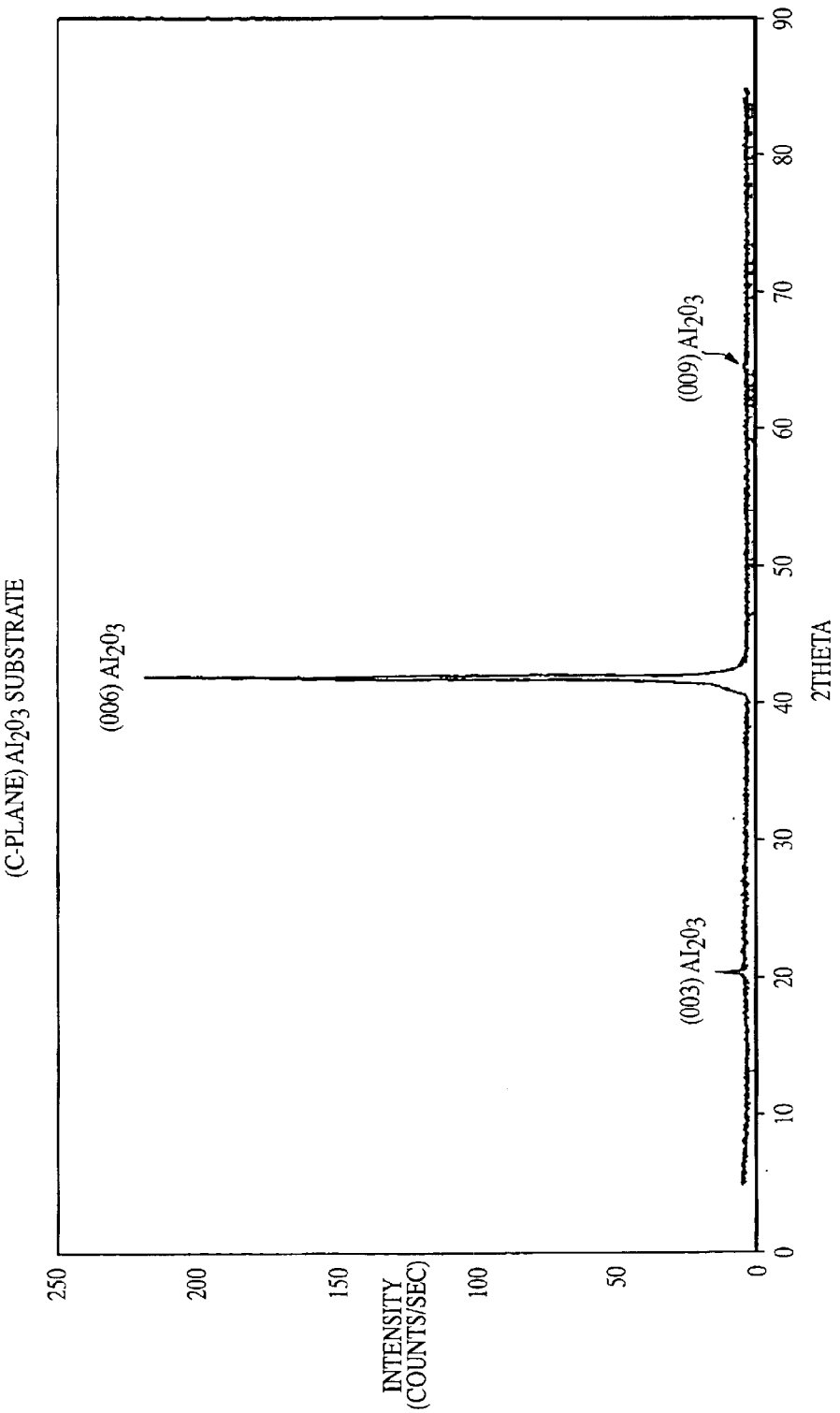
FIGS. 5A and B show the result of 2 XRD scans of (0006) oriented $Al_2O_3$ and the GaN film on (0006) oriented $Al_2O_3$, respectively.
Figure 5B:
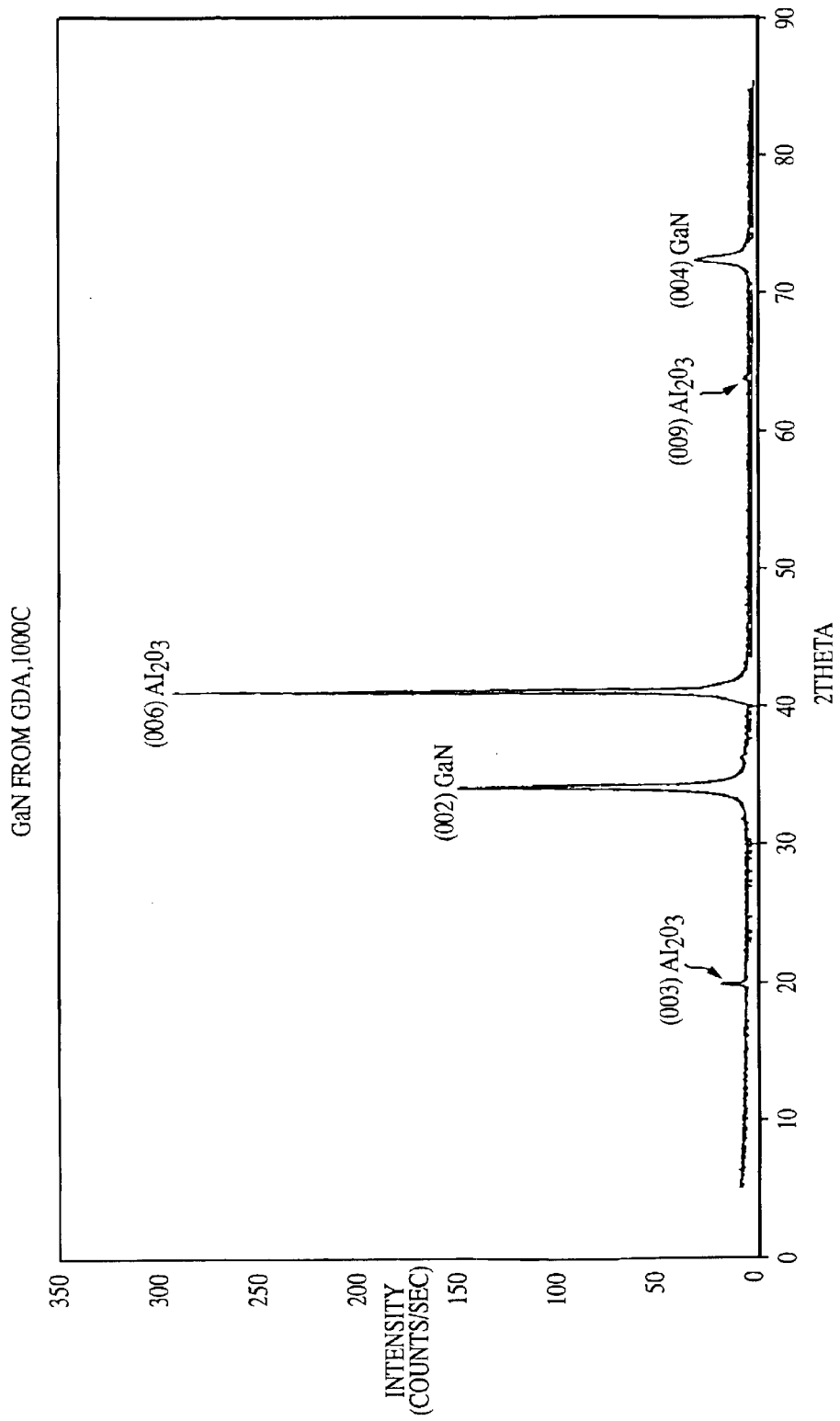

The crystallinity and phase structure of post-heat treated GaN films were determined by out-of-plane (2theta-omega)

x-ray diffraction ("XRD") scans (X'Pert, Philips, Analytical, Amsterdam, Netherlands). XRD conditions included a 2theta range of 5°–85°, a step size of 0.02°; a step time of 2 seconds, and source slit sizes of ¼° and ½°, in their respective order and a receiving slit size of ¼°. FIGS. 5A and 5B show the result of 2 XRD scans of (0006) oriented $Al_2O_3$ and the GaN film on (0006) oriented $Al_2O_3$, respectively. Peaks characteristic of $Al_2O_3$ appear at 20.5°, 41.7°, and 64.3° for the (0003), (0006) and (0009) plane reflections, respectively. XRD peaks associated with GaN are at 34.6° and 73.0°, associated with the (0002) and (0004) plane reflections, respectively, of hexagonal GaN. It can be seen from FIG. 5B that the out of plane relationship between the GaN and $Al_2O_3$ is (0002)//(0006).

Figure 6:
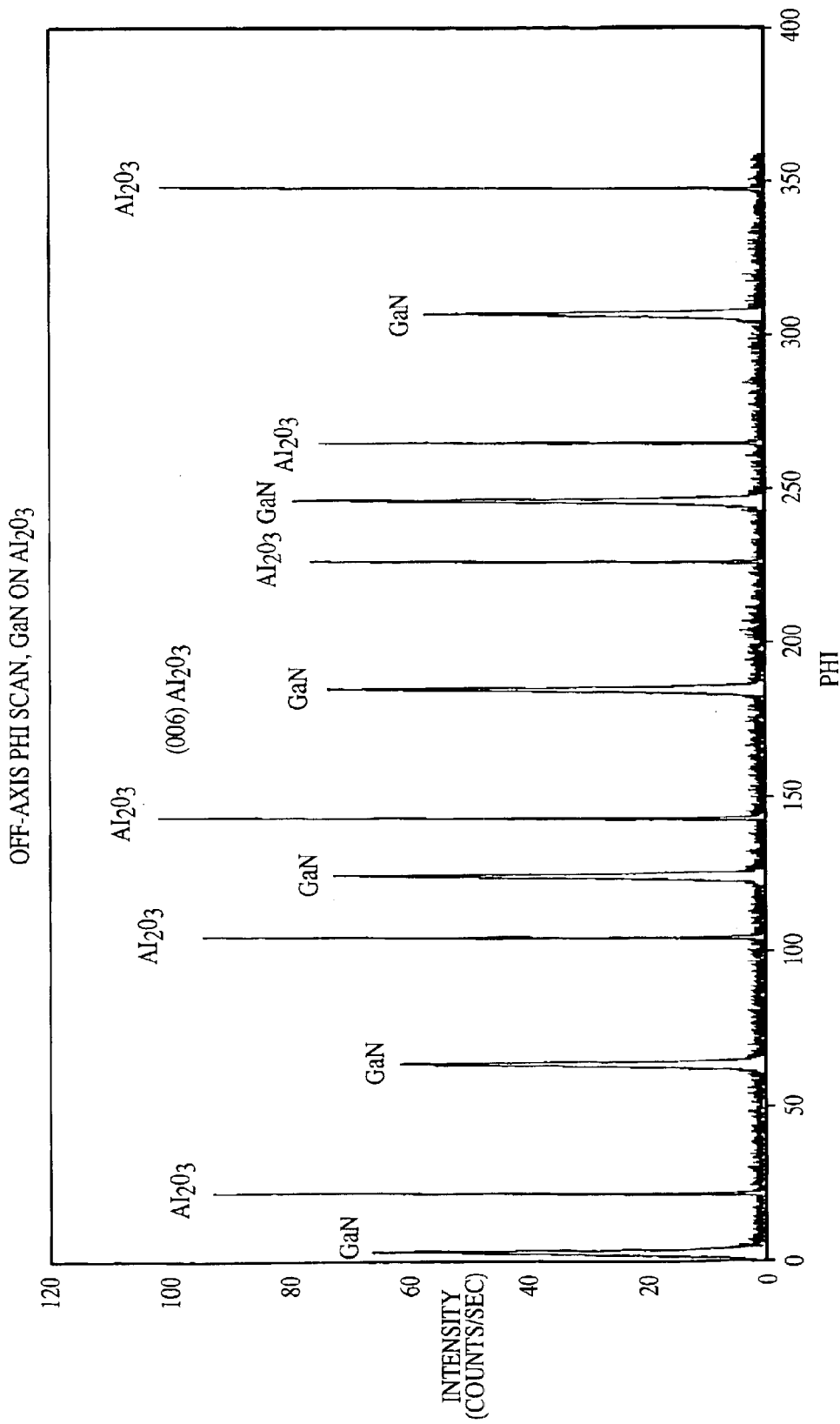
FIG. 6 shows the 6-fold symmetry (60° spacing) for diffraction from the (10–12) GaN plane normal to the substrate surface.

The quality of the film (in-plane) was also investigated by doing an off-axis phi scan. FIG. 6 shows the 6-fold symmetry (60° spacing) for diffraction from the (10–12) GaN plane normal to the substrate surface. TEM studies of GaN on c-plane sapphire have shown the in-plane relationship of GaN to sapphire is GaN (-12–10)//Al203(01–10); see Onitsuka et al. This is confirmed in our study by selected area diffraction ("SAD") of transmission electron microscopy ("TEM") studies (see below).

Figure 7:
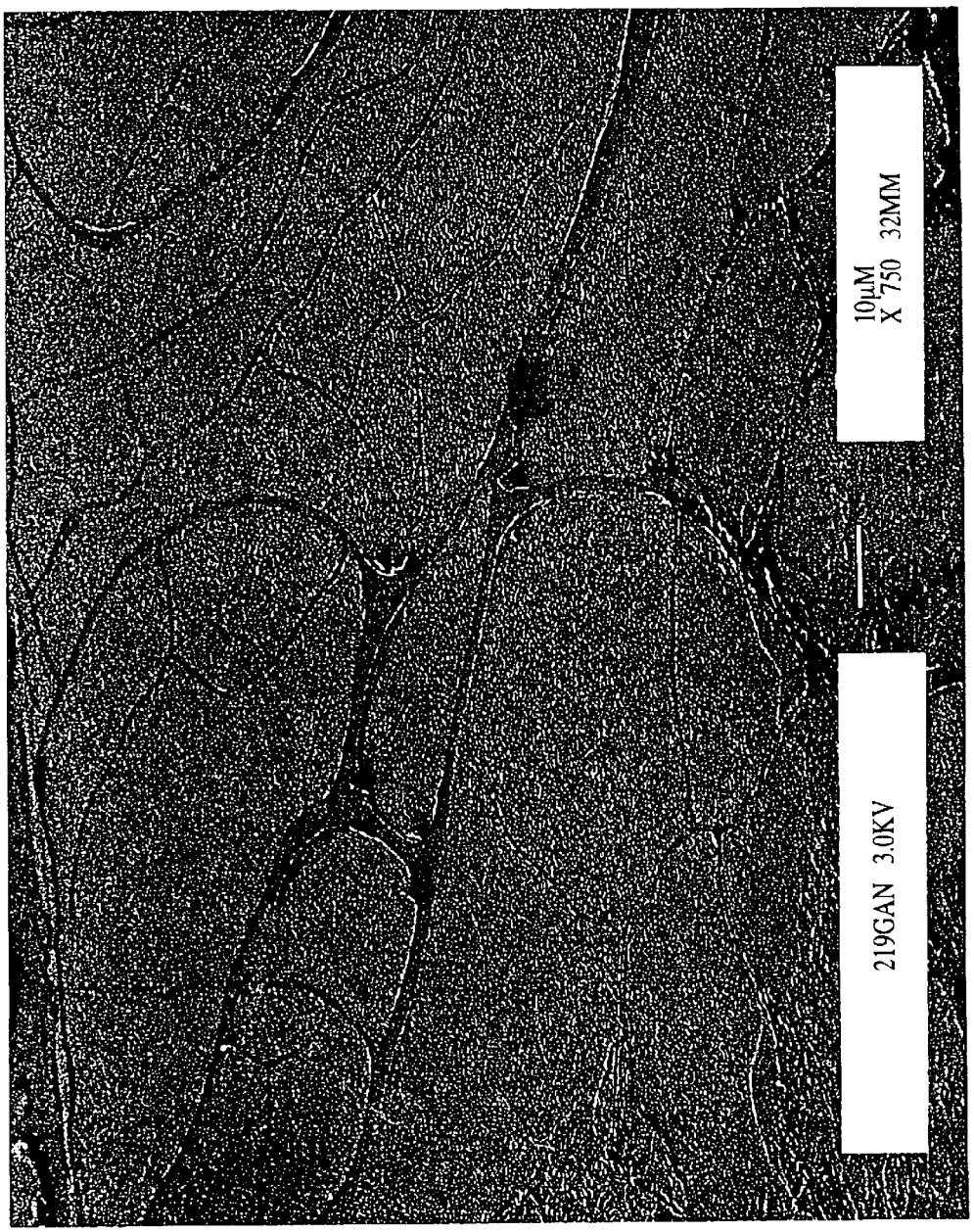
FIG. 7 shows substrates nearly completely coated with a film except in regions where the film appears to have shrunk and exposed the substrate.
Figure 8:
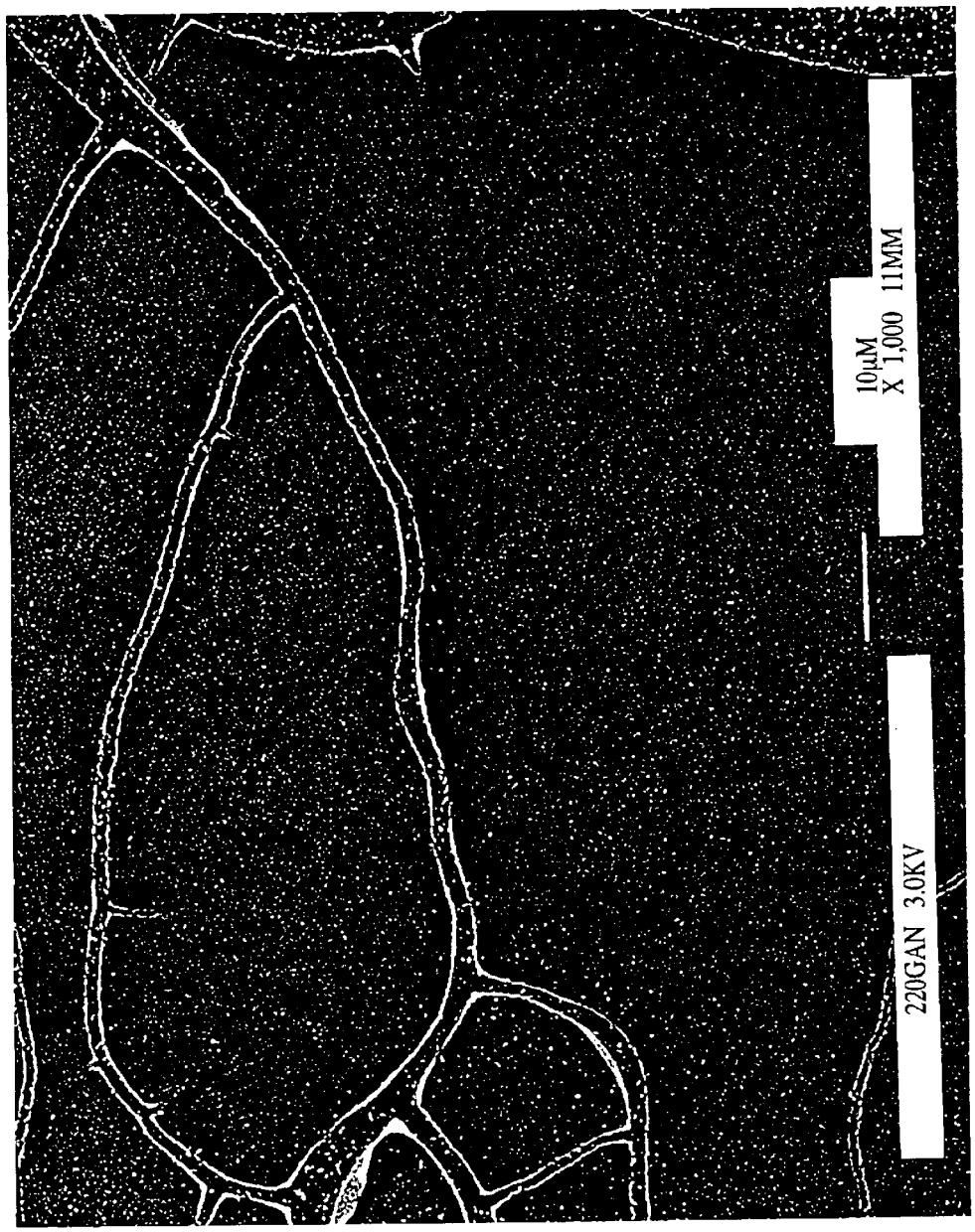
FIG. 8 shows exposed regions dotted with hexagonally shaped grains on the film and within the exposed regions.

Scanning electron microscopy ("SEM") (JEOL 6300F, Japan) was used to observe the thin film surfaces. Films were coated with a thin conducting layer of gold prior to observation. FIG. 7 shows that substrates are nearly completely coated with a film except in regions where the film appears to have shrunk and exposed the substrate. The edges of thicker film regions have peeled up indicating a tension within the film from constraint by the underlying substrate. The exposed regions are dotted with hexagonally shaped grains of about 100 nm–1 μm diameter, as shown in FIG. 8. Some of these grains have grown together into larger faceted grains. These grains may be present due to an evaporation-recondensation process.

Figure 9:
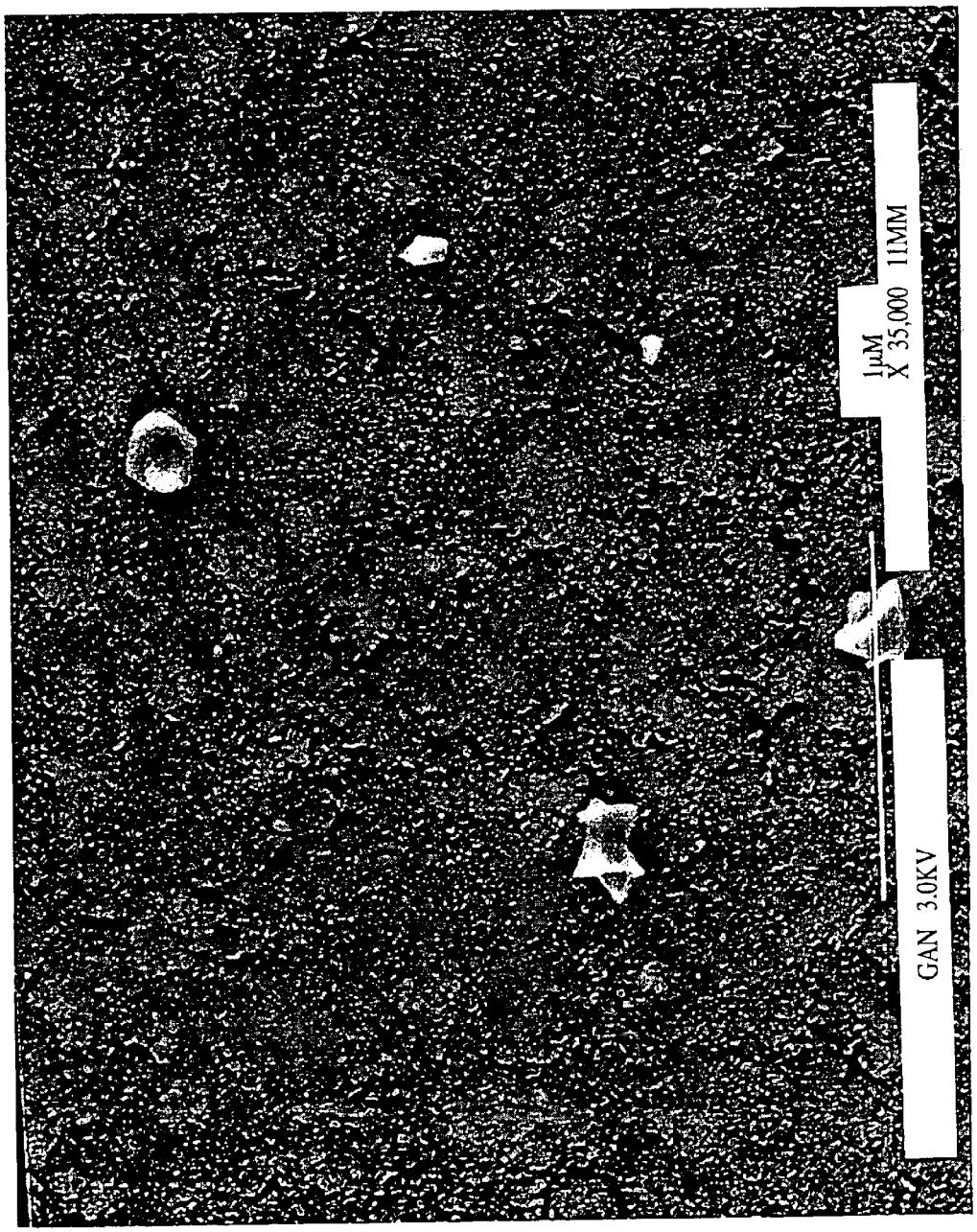
FIG. 9 shows film regions that appear to have a low density network of crystallites with what appear to be epitaxial grains (lighter) which are consuming smaller crystallites.

FIG. 9 shows that the film regions appear to have a low density network of crystallites with an average grain size of 20–25 nm. However, within this network of nanocrystalline material, there seems to be larger (100–500 nm) grains, which are consuming the smaller grains. In this case, it would appear that another mechanism is dominant: the larger grains are growing by grain boundary motion and consuming smaller nanocrystals. This is similar to some results seen by Miller, Lange, and Marshall who studied the grain growth of yttria doped zirconia films. Miller et al. In their study, an initial layer of polycrystalline film grew to a single crystal material by the growth of certain grains at the expense of smaller grains. They indicated that the smaller grains grew in order to lower the overall free energy term by reducing the grain boundary energy term. This can be seen in Equation (8), $$E = A_s \Psi_s + A_b \Psi_b + A_i \Psi_i + A_{sub} \Psi_{sub} \quad (8)$$

where $A_s$ is the film-vapor surface area, $A_b$ is the grain boundary area, $A_i$ is the film-substrate interfacial area, $A_{sub}$ is the substrate-vapor area, and the $\Psi$ terms are the corresponding energies of each area term. Since GaN is grown on a single crystal substrate material, it is assumed that the grains of the film will adopt an orientation, which will minimize the interfacial energy term, $\Psi_i$. These grains have the (0002) GaN orientation as indicated by XRD 2theta-omega scans. The exact in-plane orientation can be determined by TEM.

Figure 10:
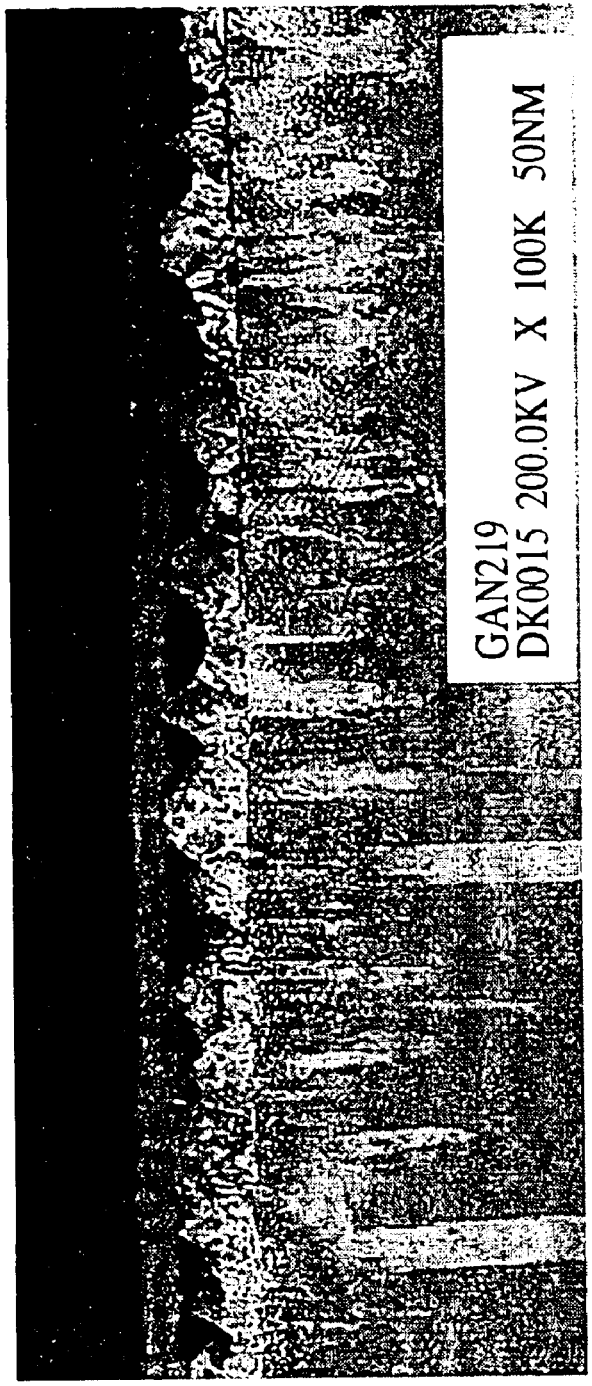
FIG. 10 shows a typical cross-sectional micrograph of GaN on c-plane sapphire.

Cross-sectional TEM specimens were prepared by a mechanical thinning method (dimpling method) described in a paper by Strecker; see Strecker. Specimens were then ion milled (Model 691, Gatan Inc., Pleasanton, Calif.) until they are electron transparent. Cross sectional TEM analysis (JEOL-2000, Japan) was done using an accelerating voltage of 200 keV. The zone axis used is the common axis. Cheng et al., Bull. Che. Soc. Jpn.; Weiller and Partido; Panda et al.; Kisailus and Lange; Onitsuka et al.; Miller et al.; Strecker, Kisailus et al.; L'ov; Van de Walle et al. FIG. 10 shows a typical cross-sectional micrograph of GaN on c-plane sapphire. The sample was prepared from a 0.2M solution of GDA coated at 3000 rpm for 60 seconds. The film was reacted with ammonia at room temperature for 1 hour followed by a heat treatment in nitrogen to 1000° C. for 30 min. The film appears to be continuous with flat regions of about 20 nm with larger (50–75 nm) saw tooth shaped grains growing out of the 20 nm layer at 50 nm increments.

Figure 11:
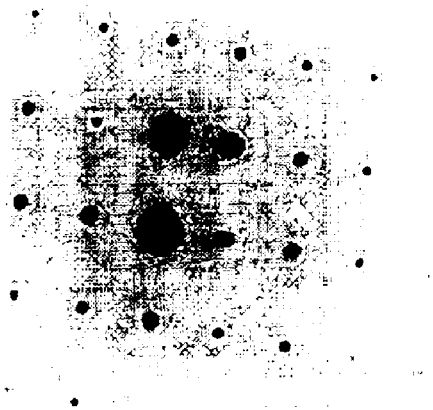
FIG. 11 shows the SAD pattern of sapphire.
Figure 12:
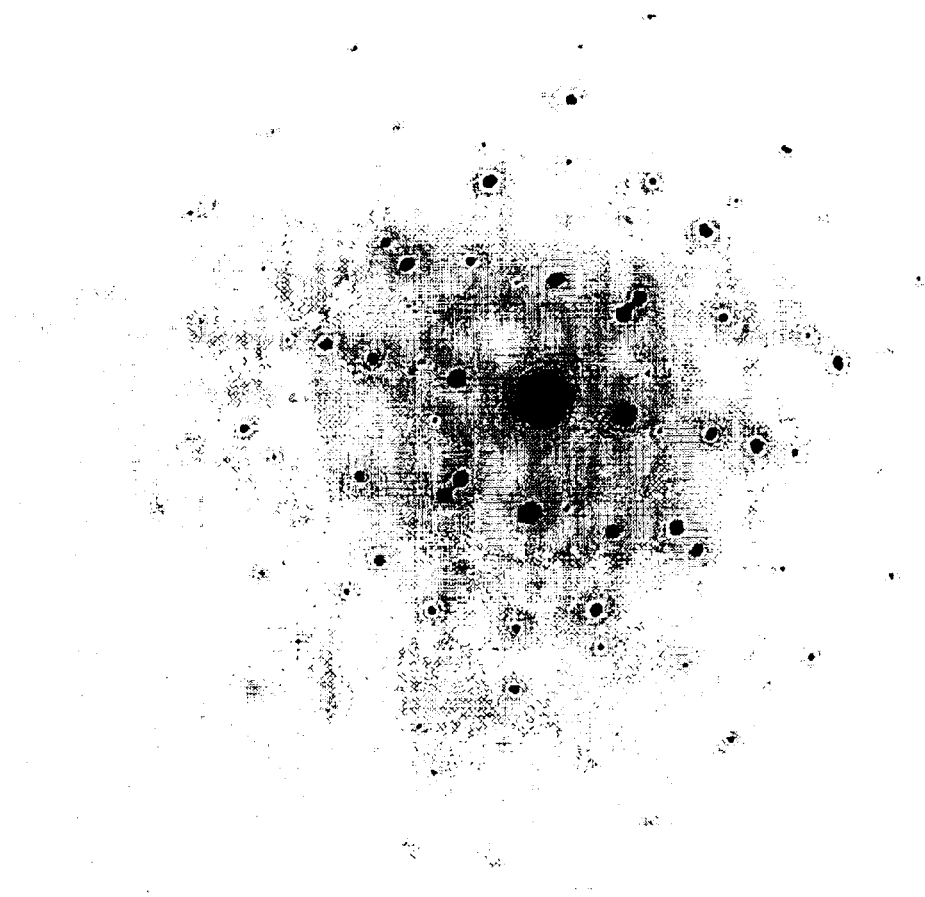
FIG. 12 shows the SAD pattern of GaN+sapphire.
Figure 13:
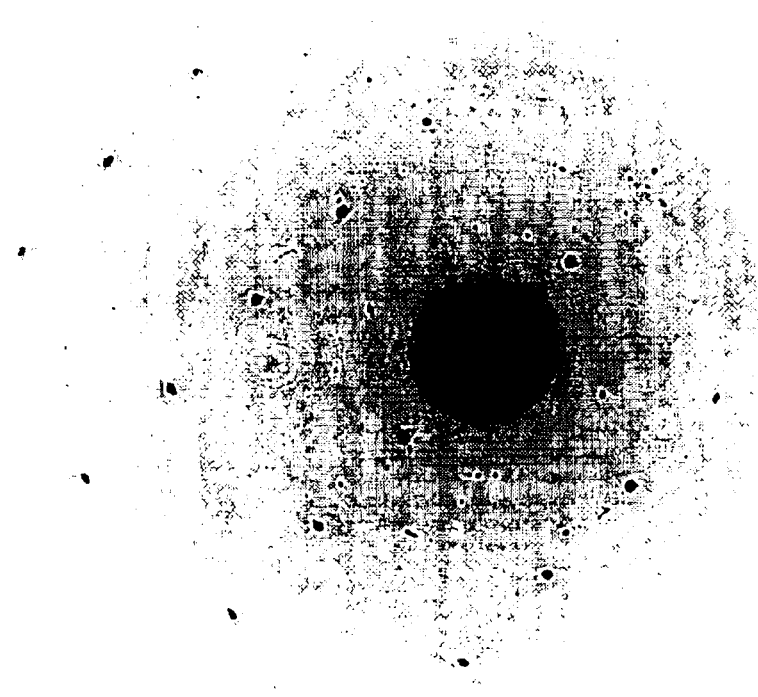
FIG. 13 shows the SAD pattern of GaN.
Figure 14:
FIG. 14 is a dark field image taken of a similar region of the film using the (0002) spot of GaN.

SAD was used to determine the crystalline orientations of the film and substrate as well as the epitaxial relationship between GaN and sapphire. FIGS. 11, 12 and 13 show SAD patterns of the sapphire, GaN+sapphire, and GaN, respectively. FIG. 12 shows that the GaN layer is epitaxial to sapphire with the following orientations: GaN (0001)// $Al_2O_3$ (0001) and GaN (-12–10)//$Al_2O_3$ (01–10). In addition to the epitaxial, hexagonal GaN spots, a faint set of rings is present, indicating some polycrystallinity. In FIG. 10, there is a darker 20 nm thick layer above the film. It appears to be more dense than the glue used to prepare the TEM specimen and contains some nanocrystalline grains. It is proposed that these grains are the source of the rings in FIGS. 12 and 13. FIG. 14 is a dark field image taken of a similar region of the film using the (0002) spot of GaN. It shows the epitaxial grains growing from the interface but also shows <5 nm grains in the dark layer above the film. It is proposed that this layer is just the glue from the preparation of the specimen which had trapped some loose polycrystalline grains from excess material on the film, which is pyrolyzed and crystallized with no template to grow upon. During preparation of the TEM specimen, the sample was repeatedly heated and cooled such that the glue could become less viscous and move from the surface of the film, entrapping grains along the way.

Figure 15:
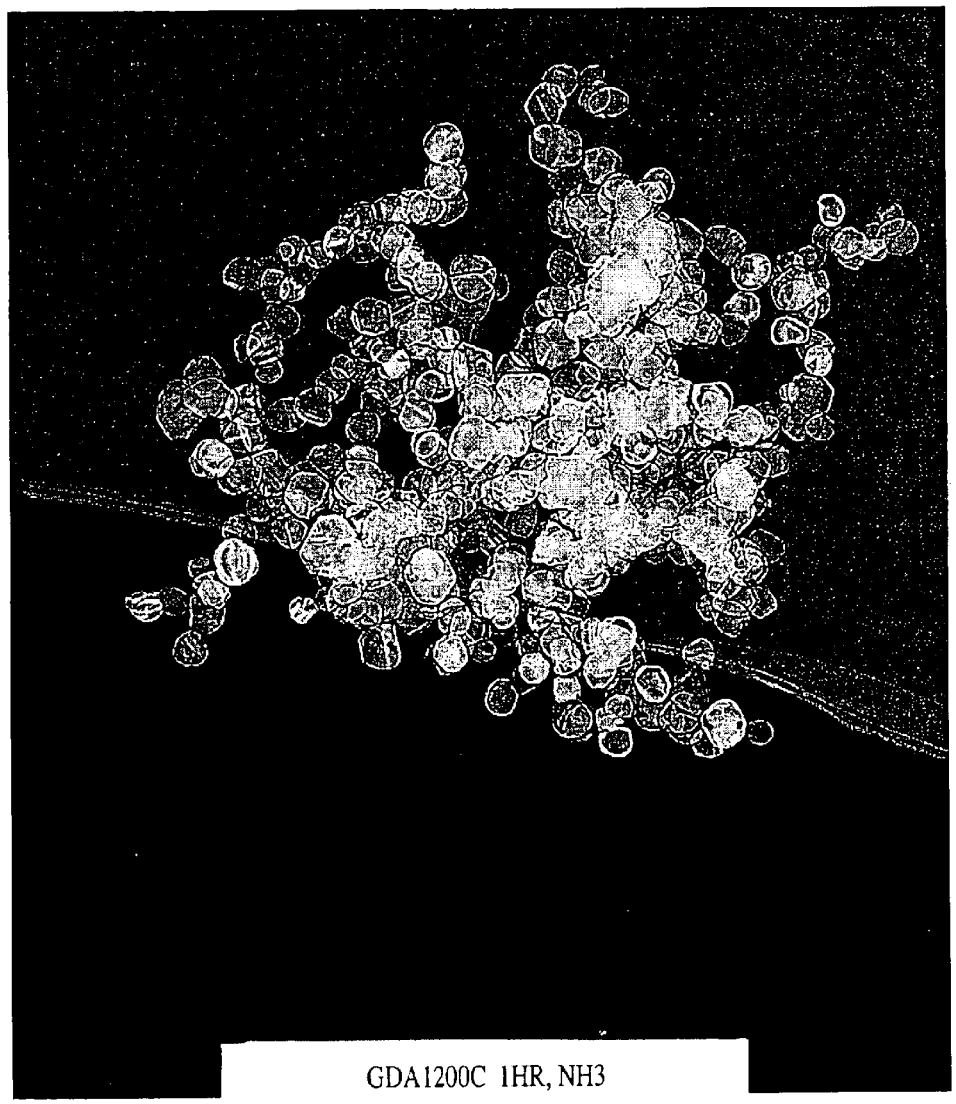
FIG. 15 shows evidence for evaporation-recondensation (necks between particles)
Figure 16:
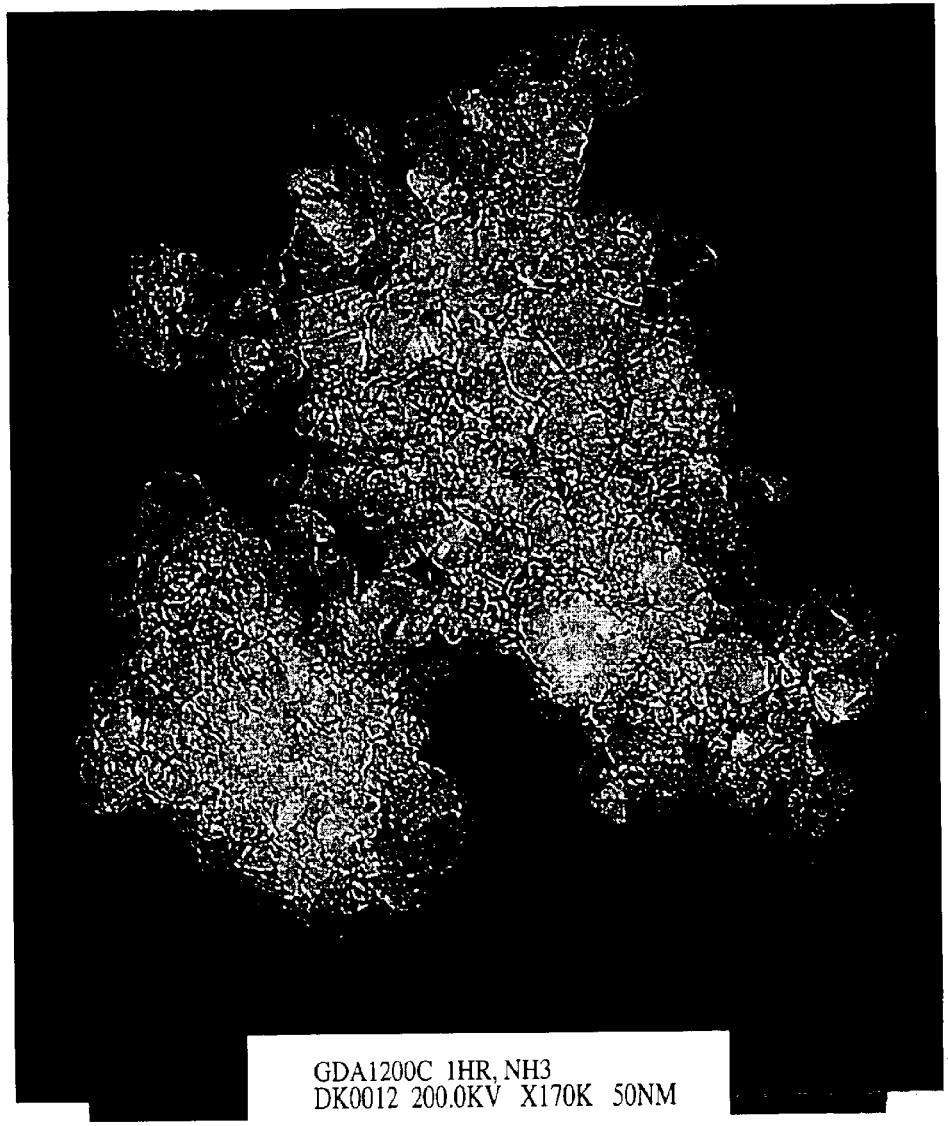
FIG. 16 shows evidence for grain boundary movement (triple grain boundaries and non-equiaxed particles)
Figure 17A:
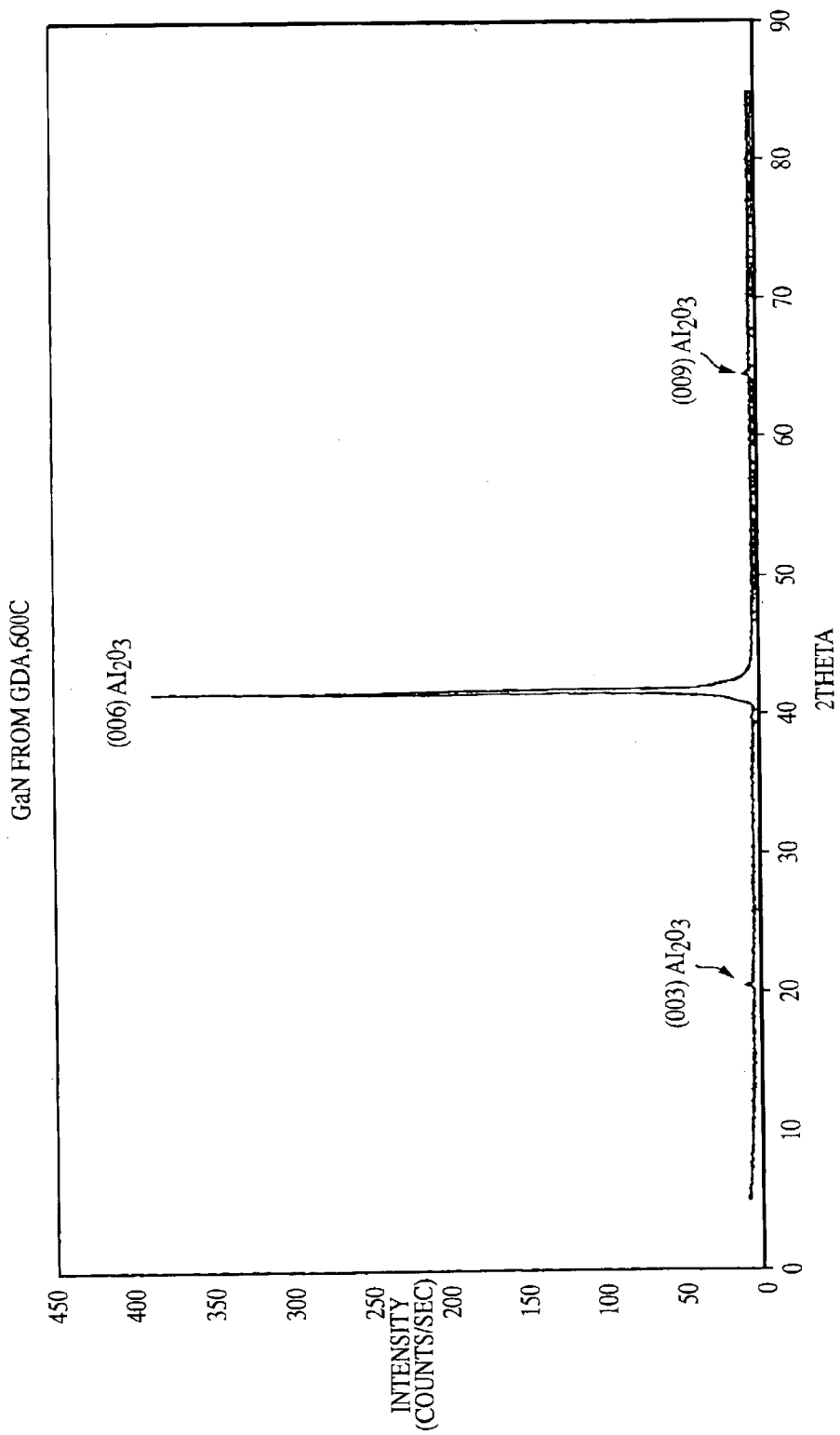
FIGS. 17A–D show XRD studies at 600° C. wherein the film is still amorphous, but by 900° C., epitaxial peaks are present with a FWHM indicative of small grain size.
Figure 17B:
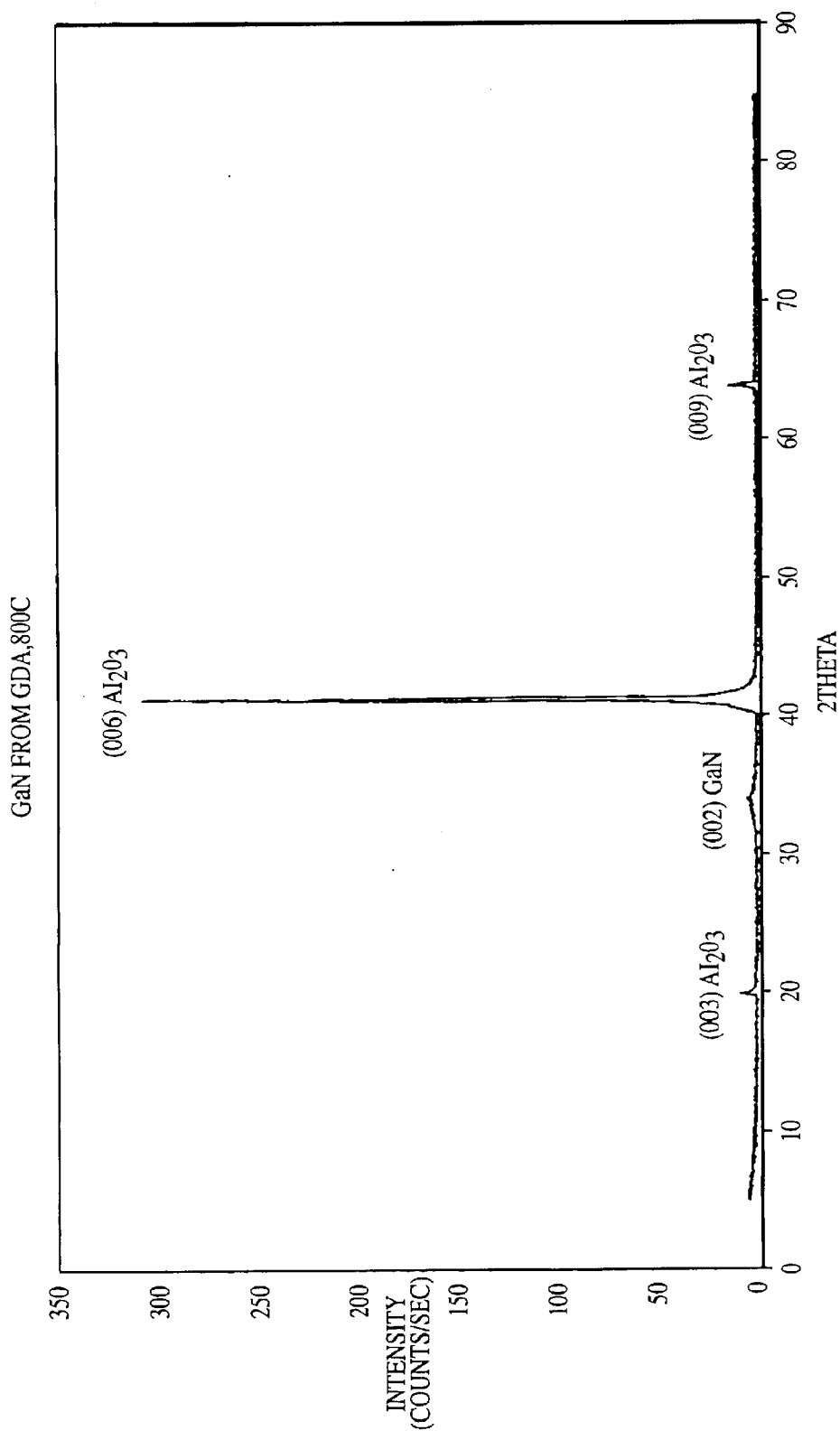
Figure 17C:
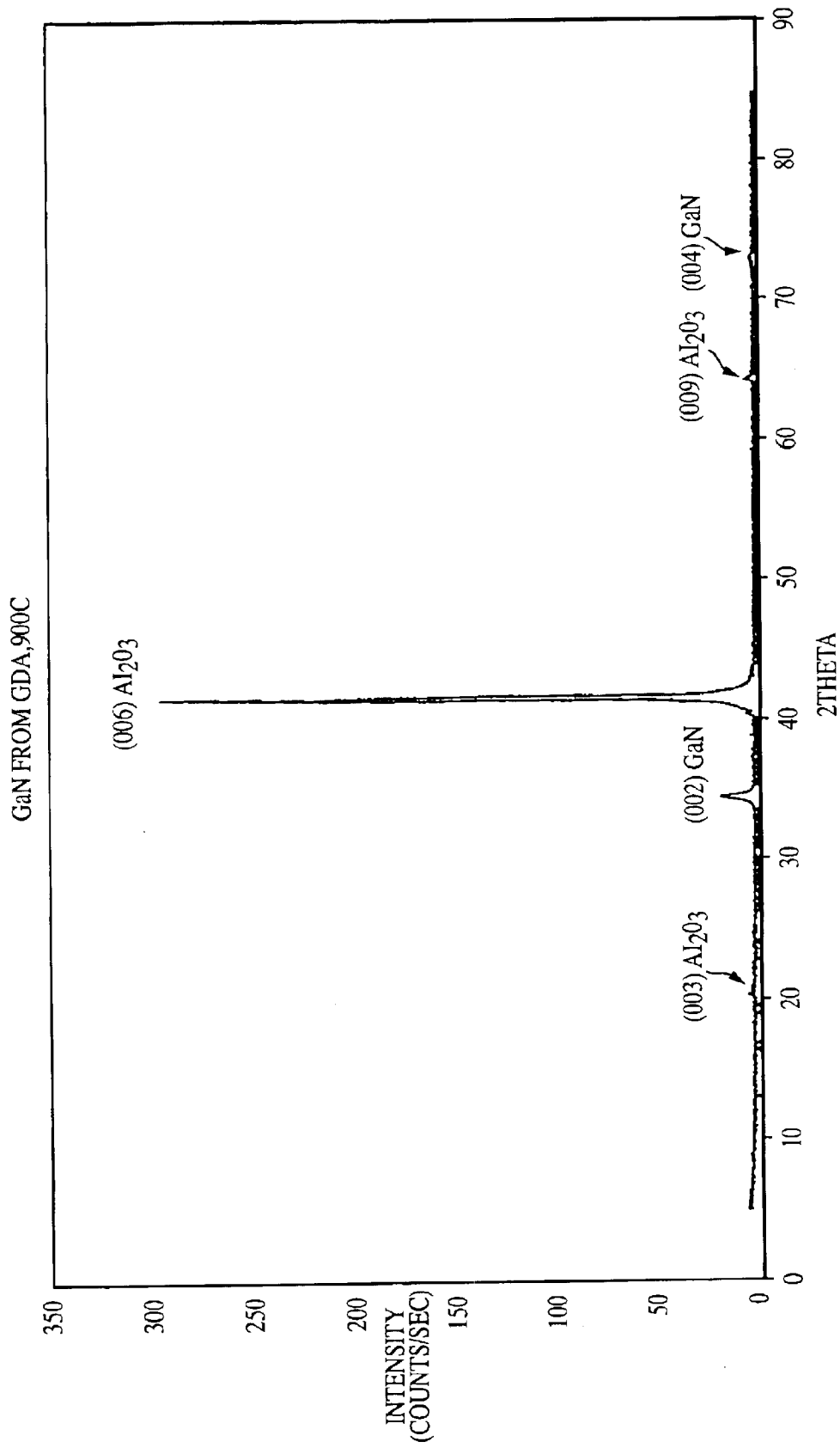
Figure 17D:
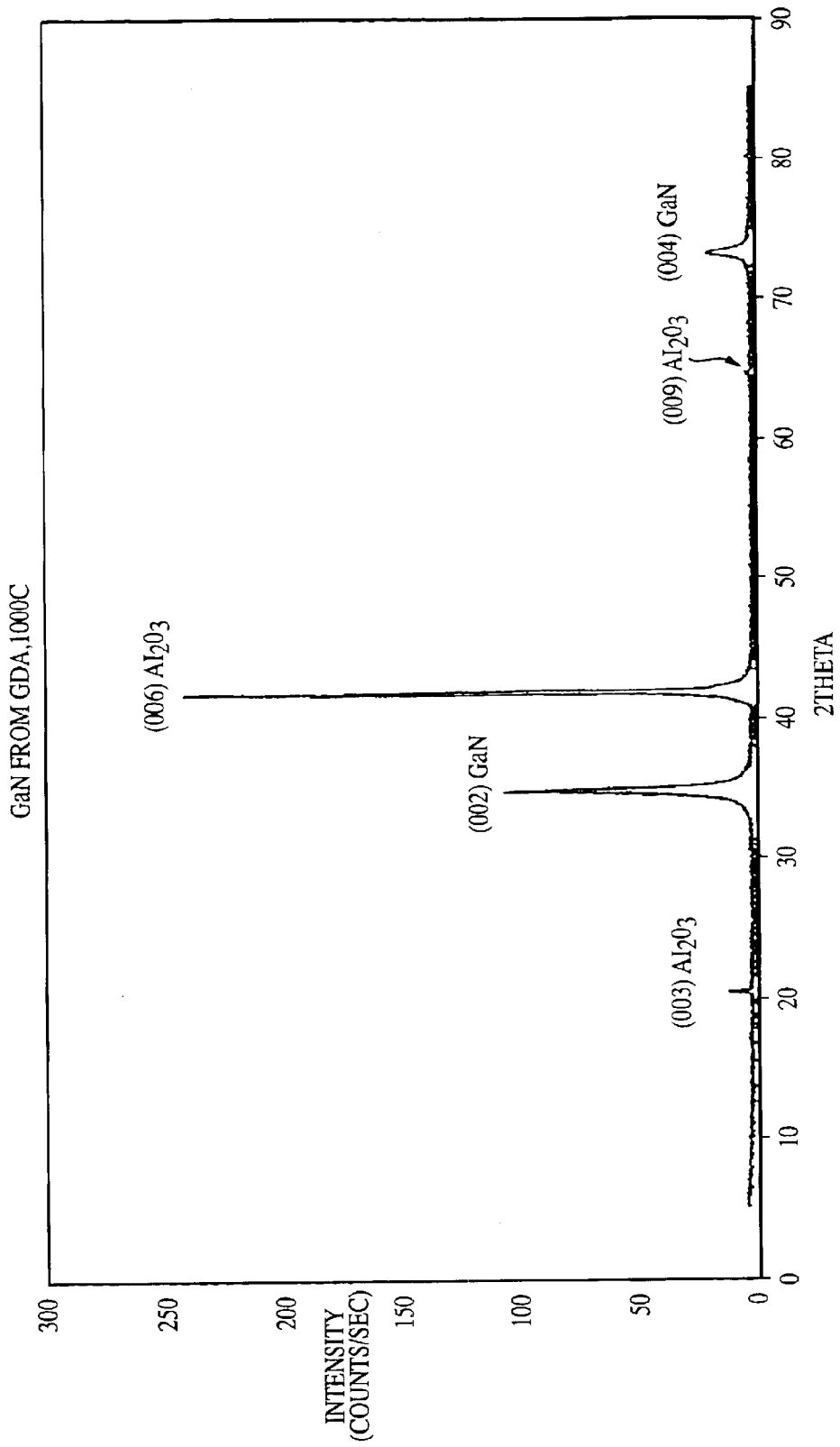

Grain growth and densification studies of GaN powders have been performed. Kisailus et al. The powders were prepared from the GDA precursor in either $NH_3$ or $N_2$ atmospheres at various heat treatment temperatures. Evidence showed that the GaN powders were amorphous at lower temperatures (<800° C.). At about 800° C.–900° C., small (5–7 nm) GaN grains were observed inside an amorphous matrix. As the temperature increased, grain size increased. TEM studies showed that the particles reached an average diameter between 40–50 nm by 1100° C. Evidence for both evaporation-recondensation (necks between particles) and grain boundary movement (triple grain boundaries and non-equiaxed particles) was uncovered in these studies and can be seen in FIGS. 15 and 16, respectively.

It is presumed that similar behavior is occurring in thin films of GaN prepared according to this invention by depositing GAD on c-plane sapphire. XRD studies, as shown in FIGS. 17A–D, have shown that at 600° C., the GaN thin film is still amorphous, but by 900° C., epitaxial peaks are present with a FWHM indicative of small grain size. As the temperature is increased, the epitaxial peak sharpens (FWHM decreases) indicating an increase in the grain size. SEM micrographs also have shown this to be evident (FIG. 9).

At higher temperatures, weight loss studies of GaN powders in nitrogen atmospheres have shown that at temperatures greater than 1000° C., the material begins to decompose to Ga metal plus nitrogen gas. A study done on the thermal decomposition of GaN shows a similar result. L'vov. They determined that GaN undergoes a dissociative evaporation, at higher temperatures to atomic nitrogen, molecular nitrogen and gallium metal. This is also seen in thin films of GaN which, upon heat treatment to temperatures of 1200° C. in nitrogen atmospheres, almost completely disappear. In ammonia atmospheres, the temperature at which this occurs is higher due to maintained equilibrium from the larger partial pressure of atomic nitrogen, formed from the dissociation of ammonia.

Production of GaN Thin Films Using GIP or GPO

1. Method

This version of the invention uses the oxygen-containing chemical precursors gallium nitrate ($Ga(NO_3)_3$) ("GNO") and gallium isopropoxide ($Ga(OC_3H_7)_3$) ("GIP") which are non-volatile in ambient conditions. GNO, as well as other gallium salts, can be dissolved in water to form aqueous precursor solutions; GIP, as well as other gallium-based alkoxides (i.e., gallium methoxide, gallium ethoxide, etc.) can be dissolved in organic solvents (e.g., aromatics, alcohols, etc.) to form non-aqueous solutions. An amorphous film is deposited by spin or dip coating a solution of GNO or GIP onto a single crystal substrate. The film undergoes a reduction reaction with hydrogen (cracked from ammonia) and nitridation by ammonia or species of ammonia (i.e., NH2, NH, and N). The film is then crystallized at elevated temperatures to form a heteroepitaxial, crystalline GaN film.

The use of GNO and GIP avoids high volumes of ammonia (as in MOCVD routes) as well as ultra high vacuum systems (as in MBE). The capital costs for producing films are orders of magnitude less than those used by vapor routes. SiC as well as other orientations of sapphire (A, M, and R) can also be used as substrate materials for heteroepitaxial growth. These substrates have a much better lattice match with GaN and may reduce threading dislocation densities.

The process using GIP or GPO is described below in the following steps: (A) substrate preparation, (B) solution preparation, (C) film deposition, (D) reaction of precursor with both hydrogen and ammonia, (E) pyrolysis and crystallization of GaN.

A. Substrate Preparation. C-plane (0001) $Al_2O_3$ and r-plane (01–12), $Al_2O_3$ single crystal substrates were prepared as described above.

B. Solution Preparation (see FIG. 2). GIP solutions were prepared in a dry nitrogen glove box due to concerns about moisture sensitivity. Toluene (or o-xylene), used for the solution preparation, was dried by refluxing over sodium metal and benzophenone. Several freeze, pump, and thaw cycles removed absorbed gases from solvents. Gallium Isopropoxide, GIP (99.9% (metal basis) from Alfa Aesar, a Johnson-Matthey subsidiary, Ward Hill, Mass.) was weighed out to desired amounts. Solutions were prepared by adding a measured volume of anhydrous toluene to an appropriate amount of GIP to achieve the desired solution concentration. Concentrations were varied between 0.05M–0.40M, however, 0.2M was commonly used. Because the GIP dissolved readily in toluene, gentle shaking was adequate to ensure proper mixing of solutions. Solutions were filtered through a 0.2 µm teflon filter into a clean vial. The vial was capped, sealed with parafilm and stored in the glove box.

GNO solutions were prepared in air. Gallium Nitrate Hydrate, GNO (99.99% (metal basis) from Alfa Aesar, a Johnson-Matthey subsidiary, Ward Hill, Mass.) was weighed out to desired amounts. Solutions were prepared by adding a measured volume of deionized water to an appropriate amount of GNO to achieve the desired solution concentration. Concentrations were varied between 0.05M–0.40M, however, 0.2M was commonly used. Because the GNO dissolved readily in water, gentle shaking was adequate to ensure proper mixing of solutions. 1 weight percent (per weight GNO solids) of poly-vinyl alcohol, PVA (M.W.~100,000, Alfa Aesar, a Johnson-Matthey subsidiary, Ward Hill, Mass.) was added to the GNO solution as a spinning aid (i.e., to increase viscosity). The mixture of PVA with the GNO solution was heated in an oil bath to 90° C. for 1 hour to dissolve the PVA. Solutions were filtered through a 0.2 µm Teflon filter into a clean vial. The vial was capped and sealed with parafilm.

C. Film Deposition. Thin films were prepared either in a glove box (in the case of GIP solutions) or in a dust hood (for GNO solutions), as described above.

D. Reaction with Ammonia (see FIGS. 3A and B). After the precursor solution has been deposited on the substrate surface, the film/substrate was transferred into a quartz reactor tube (either flow through tube, 3A or Schlenk tube, FIG. 3b). The valves on the tube were then sealed and the tube removed from the glove box. An ammonia line was attached to the quartz tube inlet valve (in the case of GNO films, the tube was evacuated and purged several times in order to remove air). 99.99% anhydrous ammonia (Matheson Gas Products, Cucamonga, Calif.) was flowing through the line when attached to the valve fitting in order to reduce oxygen contamination. The exit fitting was connected to a mineral oil bubbler. The inlet valve was opened followed by the exit valve and the ammonia gas was allowed to pass over the film inside the tube. The ammonia flow rate was set at 50 cc/minute throughout the entire process.

F. Pyrolysis and Crystallization of GaN (see FIGS. 3A and B). While ammonia flowed through the reaction tube, the tube was heated in a clamshell style furnace at a rate of 5° C./minute to temperatures between 900° C. and 1100° C. in order to pyrolyze and crystallize the film. The peak temperature was held for 0.5–1.0 hour followed by cooling at a rate of −5° C./minute. After cooling, the tube was flushed with nitrogen gas and the sample was removed for subsequent analysis.

2. Results

A. Analysis of $Ga_2O_3$—$NH_3$ Reaction

Ammonia is an amine with hydrogen atoms substituting for carbon groups regularly seen on amines. At temperatures greater than 600° C., ammonia will crack into various species ($NH_2$, NH, $N_2$, N, $H_2$ and H). It is expected that when ammonia cracks into these species, the hydrogen produced will reduce gallium (III) oxide to gallium (I) sub-oxide (Eqn. 9).

$$Ga_2O_3 + H_2 \rightarrow Ga_2O + H_2O \tag{9}$$

The sub-oxide will further react with ammonia or amine species ($NH_2$ and NH) to form GaN (Eqn. 10).

$$Ga_2O + 2NH_3 \rightarrow 2GaN + H_2O + 4H_2 \tag{10}$$

Figure 18:
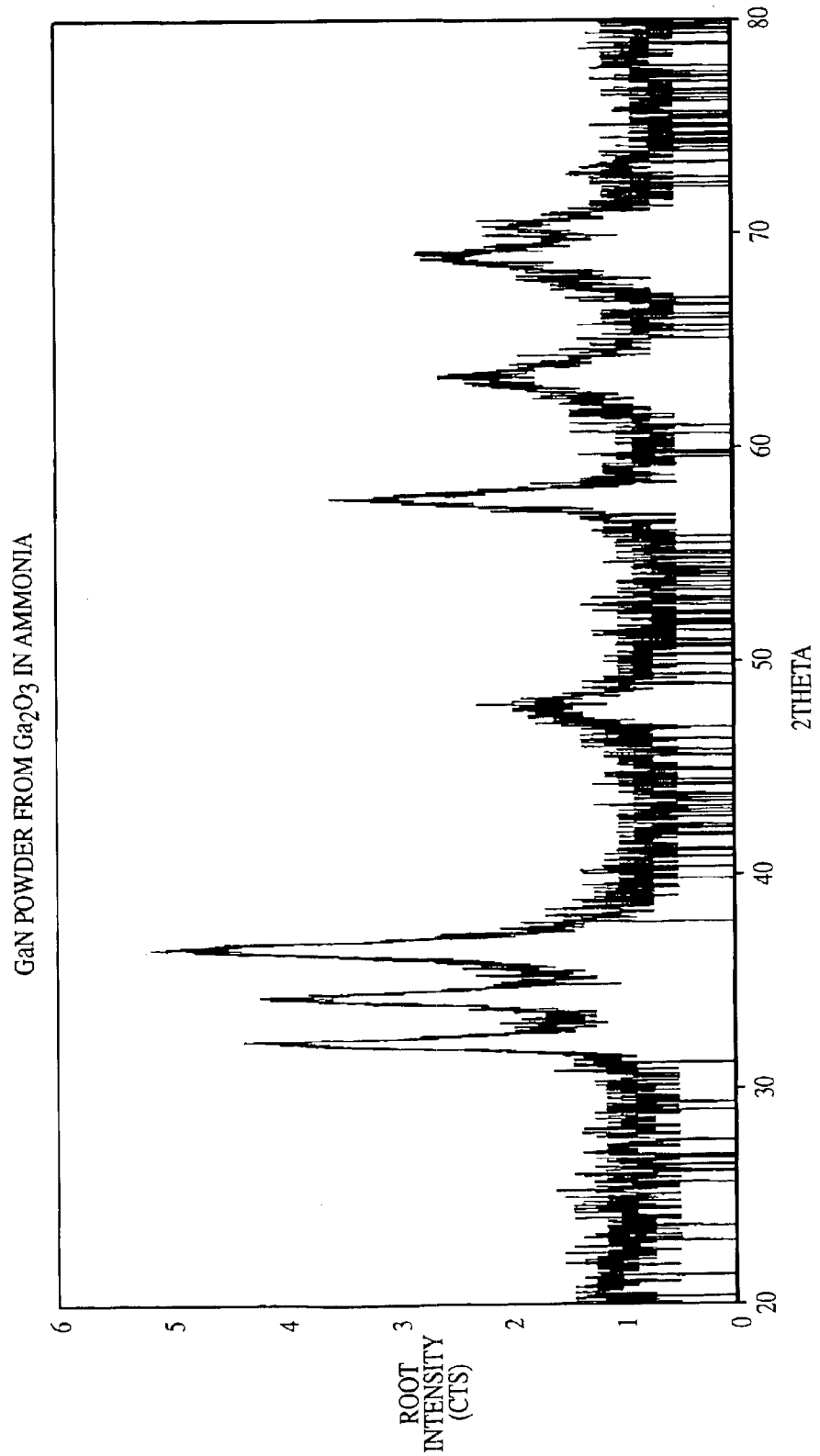
FIG. 18 shows the results of a powder scan of GaN powder from $Ga_2O_3$.

An experiment designed to test the overall reaction:

$$Ga_2O_3 + 2NH_3 \rightarrow 2GaN + 3H_2O \tag{11}$$

was performed. $Ga_2O_3$ powder (99.99% purity, Alfa Aesar, a Johnson-Matthey subsidiary, Ward Hill, Mass.) was placed in an alumina boat and put in a quartz Schlenk tube. The tube was evacuated and purged with nitrogen gas several times to remove any air. 99.99% anhydrous ammonia (Matheson Gas Products, Cucamonga, Calif.) was flowed through the tube at 50 cc/minute. The tube was heated in a clamshell style furnace at a rate of 5° C./minute to 1000° C. for 1 hour and then cooled at a rate of −5° C./minute to room temperature. After cooling, the tube was flushed with nitrogen gas and the sample was removed for subsequent analysis. The crystallinity and phase structure of these powders were determined by 2theta-omega XRD scans. XRD conditions included a 2theta range of 20°–80°, a step size of 0.02°; a step time of 2 seconds, and source slit sizes of ¼° and ½°, in their respective order and a receiving slit size of ¼°. FIG. 18 shows the results of this powder scan. All peaks seen in the x-ray scan have been identified as wurtzite (hexagonal) GaN. No $Ga_2O_3$ peaks were identified.

B. Film Analysis and Characterization

Figure 19A:
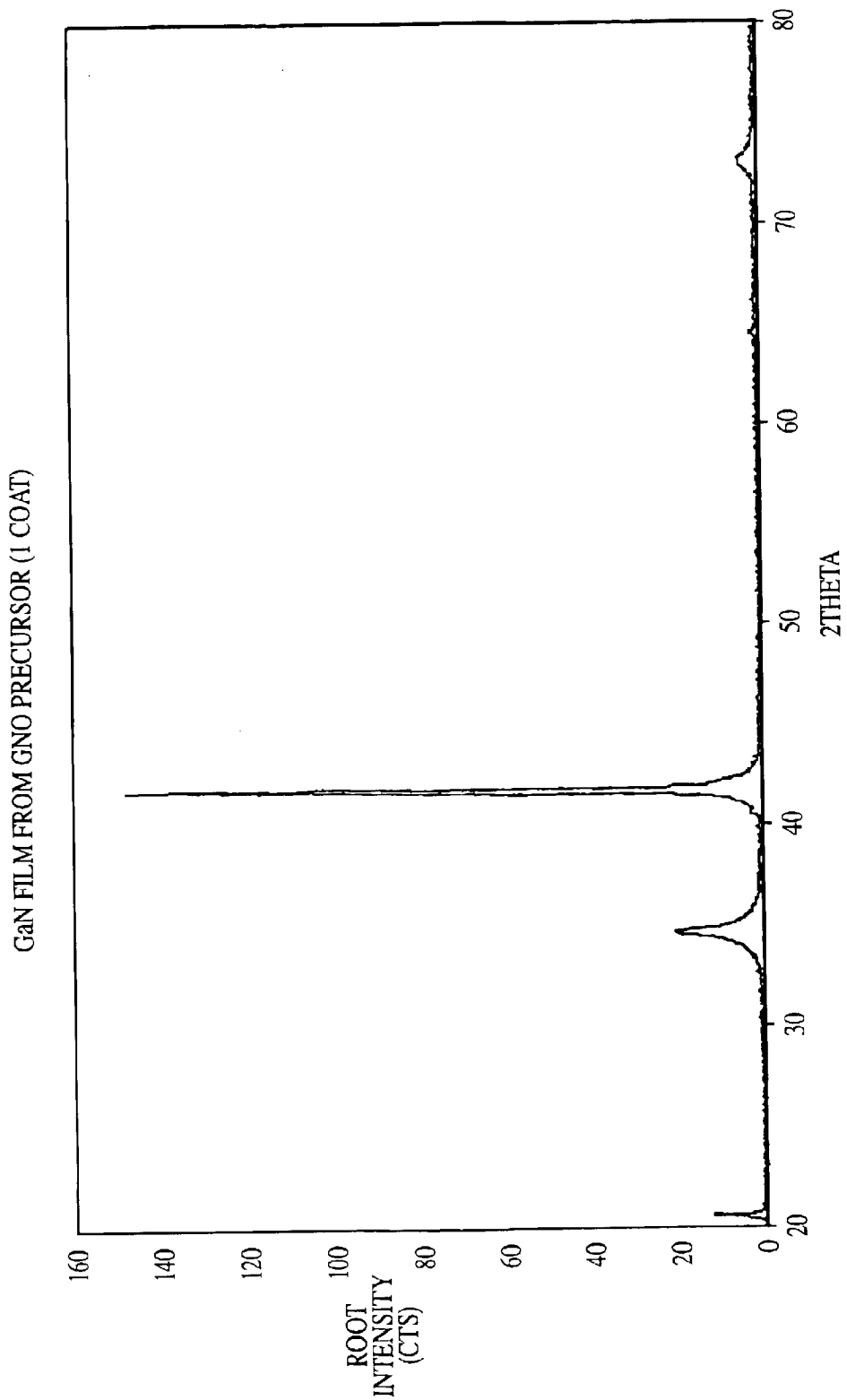
FIG. 19A shows the results of a 2 theta-omega scan of once coated GaN film from gallium nitrate precursor.
Figure 19B:
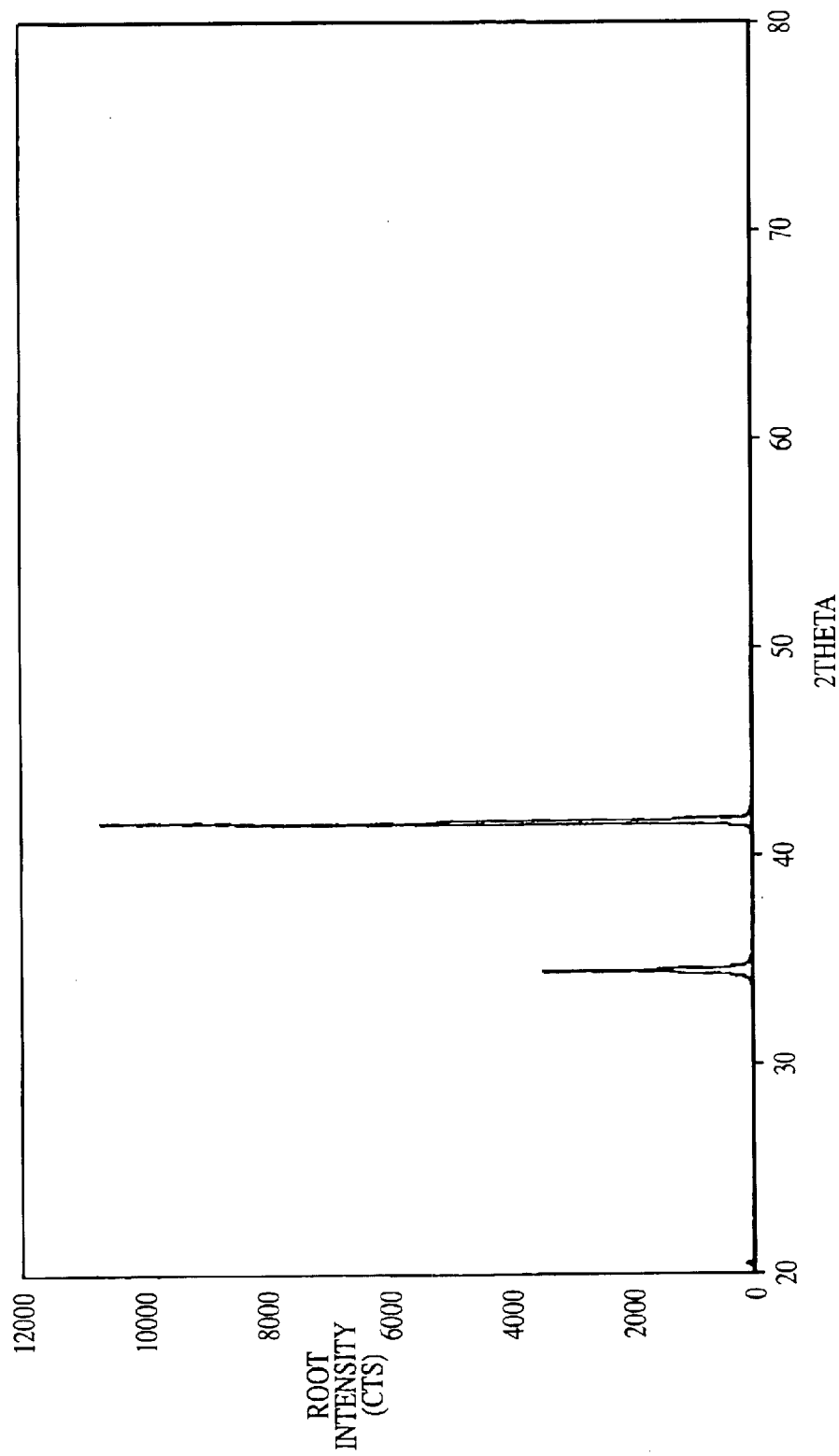
FIG. 19B shows the results of a 2 theta-omega scan of once coated GaN film from gallium isopropoxide precursor.

The crystallinity and phase structure of post-heat treated GaN films were determined by out-of-plane (2theta-omega) XRD scans. XRD conditions included a 2theta range of 20°–80°, a step size of 0.02°; a step time of 2 seconds, and source slit sizes of ¼° and ½°, in their respective order and a receiving slit size of ¼°. FIGS. 19A and B show the result of 2 XRD scans of GaN films on basal plane oriented $Al_2O_3$ (0001) from GNO and GIP precursor solutions, respectively. Peaks characteristic of $Al_2O_3$ appear at 20.5°, 41.7°, and 64.3° for the (0003), (0006), and (0009) plane reflections, respectively. XRD peaks associated with hexagonal GaN are at 34.6° and 73.0°, associated with (0002) and (0004) plane reflections, respectively. It can be seen from both FIGS. 19A and B that the out of plane relationship between the GaN and $Al_2O_3$ is (0002)//(0006).

Figure 20:
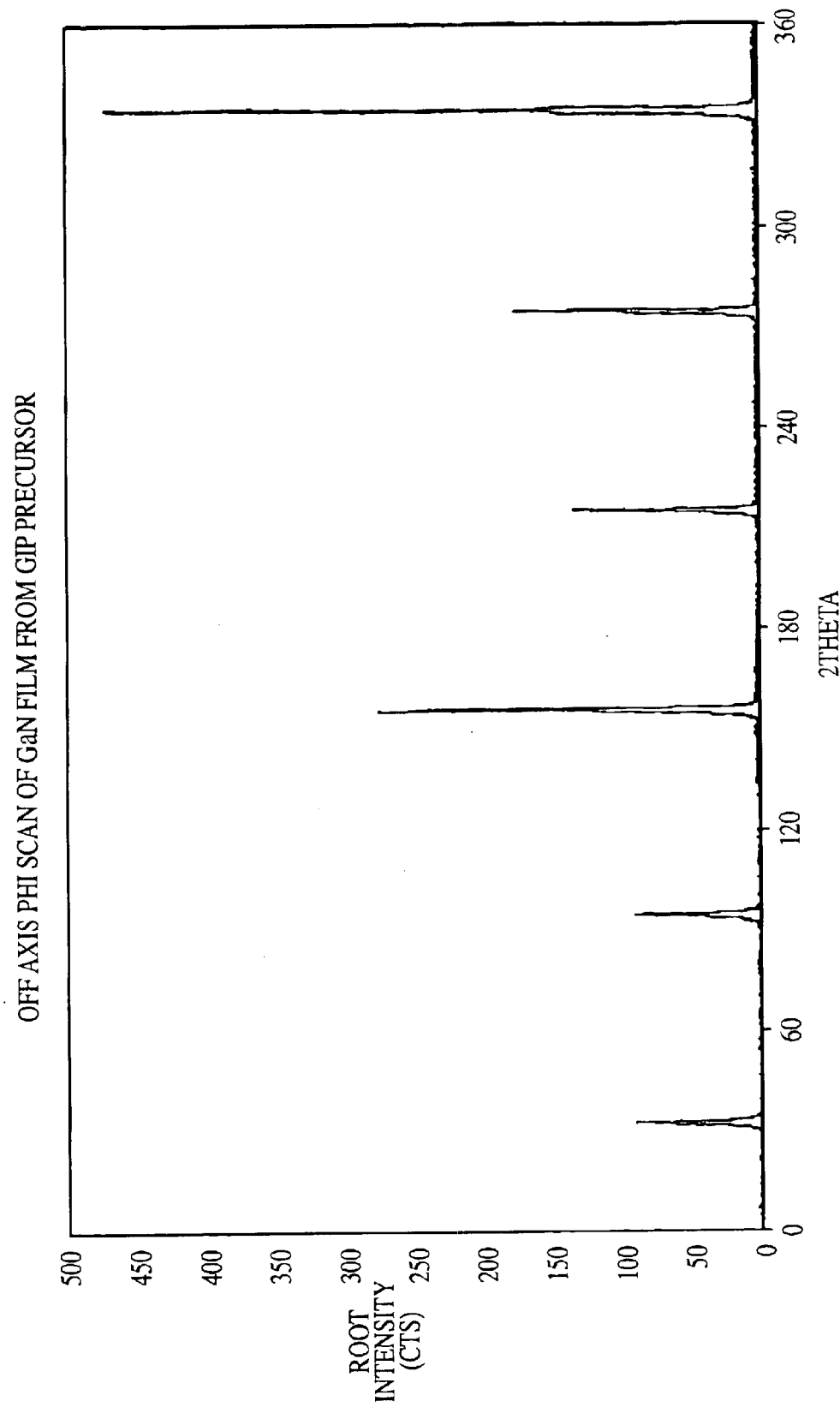
FIG. 20 shows the results of an off-axis phi scan of a GaN film from gallium isopropoxide precursor.

The quality of the film (in-plane) was also investigated by doing an off-axis phi scan. FIG. 20 (GIP based film) shows the 6-fold symmetry (60° spacing) for diffraction from the (10–12) GaN plane normal to the substrate surface. TEM studies of GaN on c-plane sapphire [15] have shown the in-plane relationship of GaN to sapphire is GaN (11–20)//$Al_2O_3$ (01–12). This is confirmed in our study by selected area diffraction of TEM studies (see below).

Figure 21:
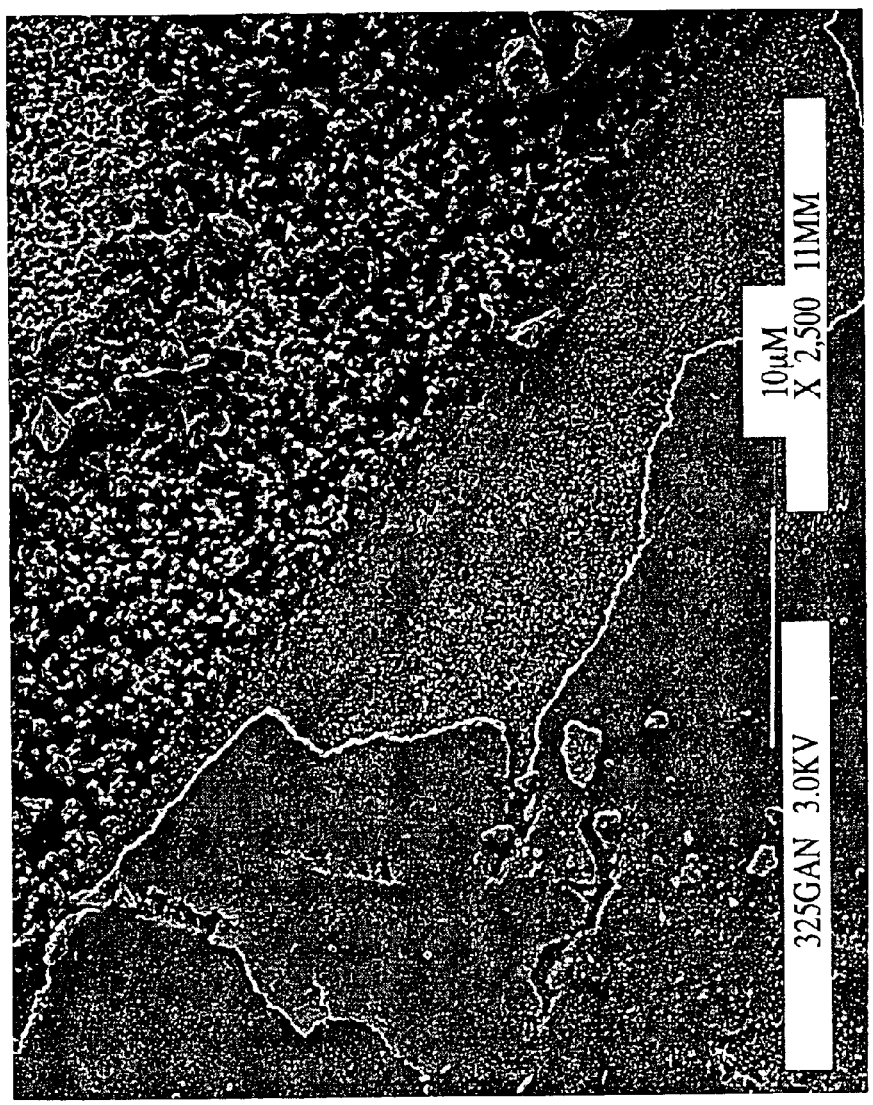
FIG. 21 is a scanning electron microscopy image at 2,500 magnification of a gallium isopropoxide based thin film surface.
Figure 22:
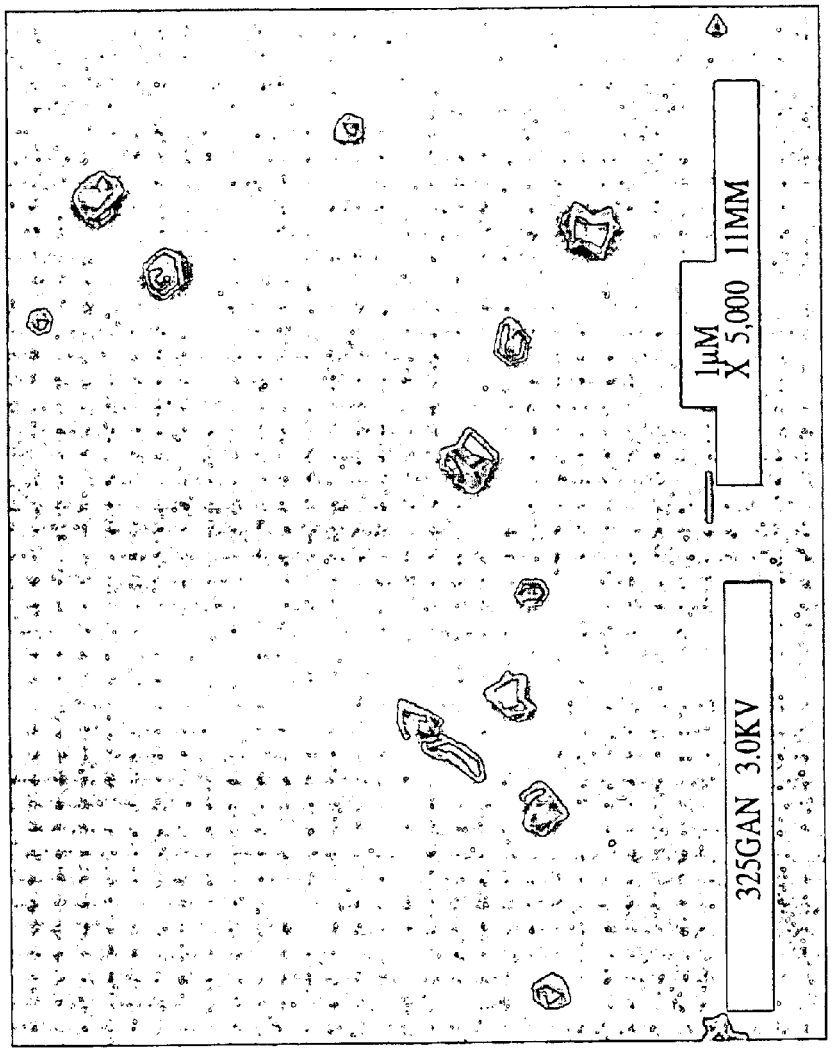
FIG. 22 is a scanning electron microscopy image at 5,000 magnification of a gallium isopropoxide based thin film surface.
Figure 23:
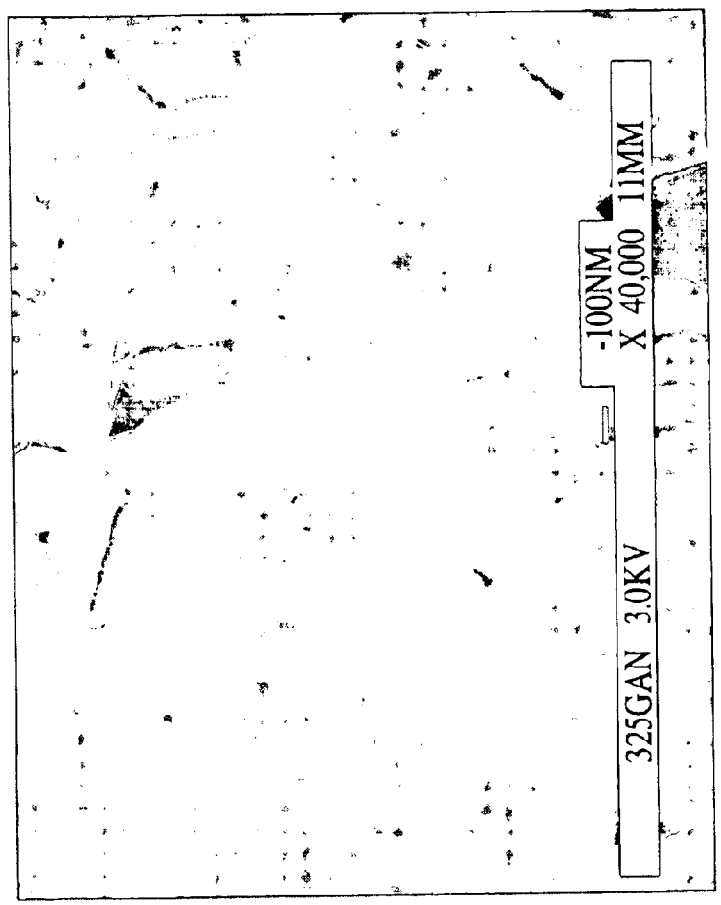
FIG. 23 is a scanning electron microscopy image at 40,000 magnification of a gallium isopropoxide based thin film surface.

SEM was used to observe the thin film surfaces, as above. Films were coated with a thin conducting layer of gold prior to observation. FIG. 21 (GIP based) shows that the substrate is nearly completely coated with a film except in regions where the film appears to have shrunk and exposed the substrate. The edges of thicker film regions have peeled up indicating a tension within the film from constraint by the underlying substrate. Below these peeled up layers, a seemingly epitaxial layer exists. FIG. 22 (GIP based) shows that the film regions appear to have a low-density network of crystallites with an average grain size of 20–25 nm. Loose, non-epitaxial grains (~100 nm in diameter) are scattered on the surface of the film. These grains may be present due to an evaporation-condensation process. FIG. 23 (GIP based) shows another region of the film in which the polycrystalline region has been removed. It appears as if grains of GaN are growing together to form a continuous film. These grains have the (0002) GaN orientation as indicated by XRD 2theta-omega scans. The exact in-plane orientation can be determined by TEM.

These SEM images of film surfaces indicate a single crystal GaN layer growing under a polycrystalline GaN layer from the interface. The grains within this single crystal layer appear to have grown together, possibly by some grain growth mechanism driven by the reduction of grain boundary area. As mentioned above, this result is similar to some results seen by Miller, Lange, and Marshall who studied the grain growth of yttria doped zirconia films.

Figure 24:
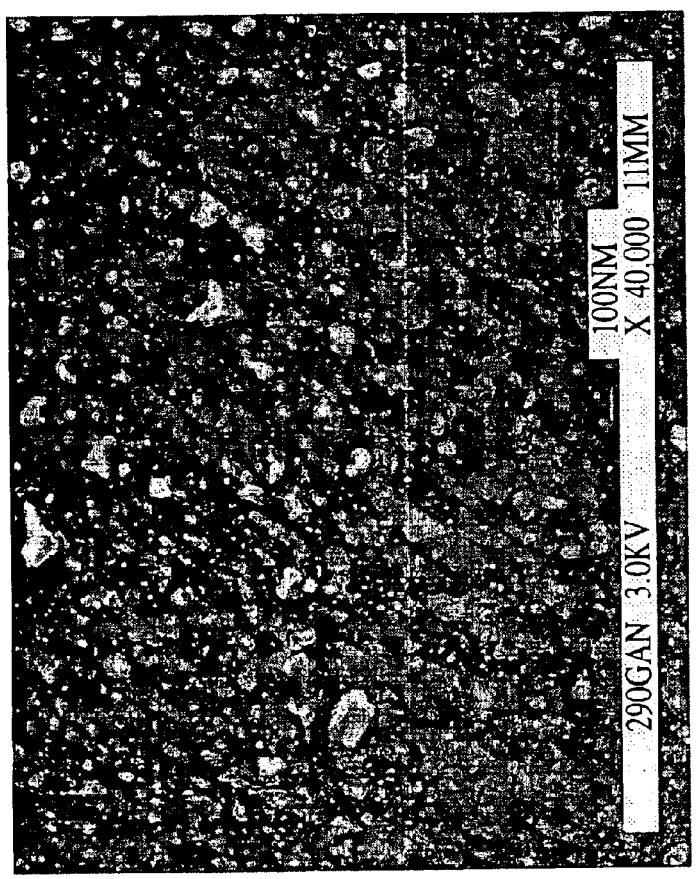
FIG. 24 is a scanning electron microscopy image at 40,000 magnification of a gallium nitrate based thin film surface.
Figure 25:
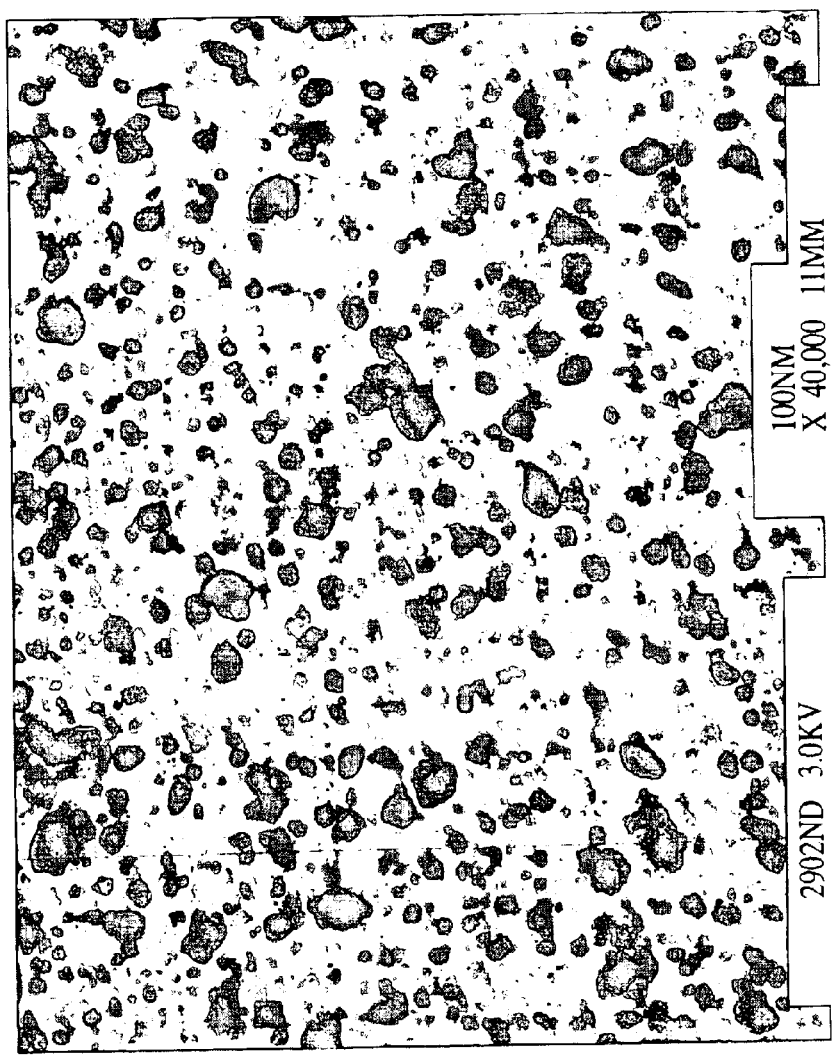
FIG. 25 is a scanning electron microscopy image at 40,000 magnification of a twice coated gallium nitrate based thin film surface.
Figure 26:
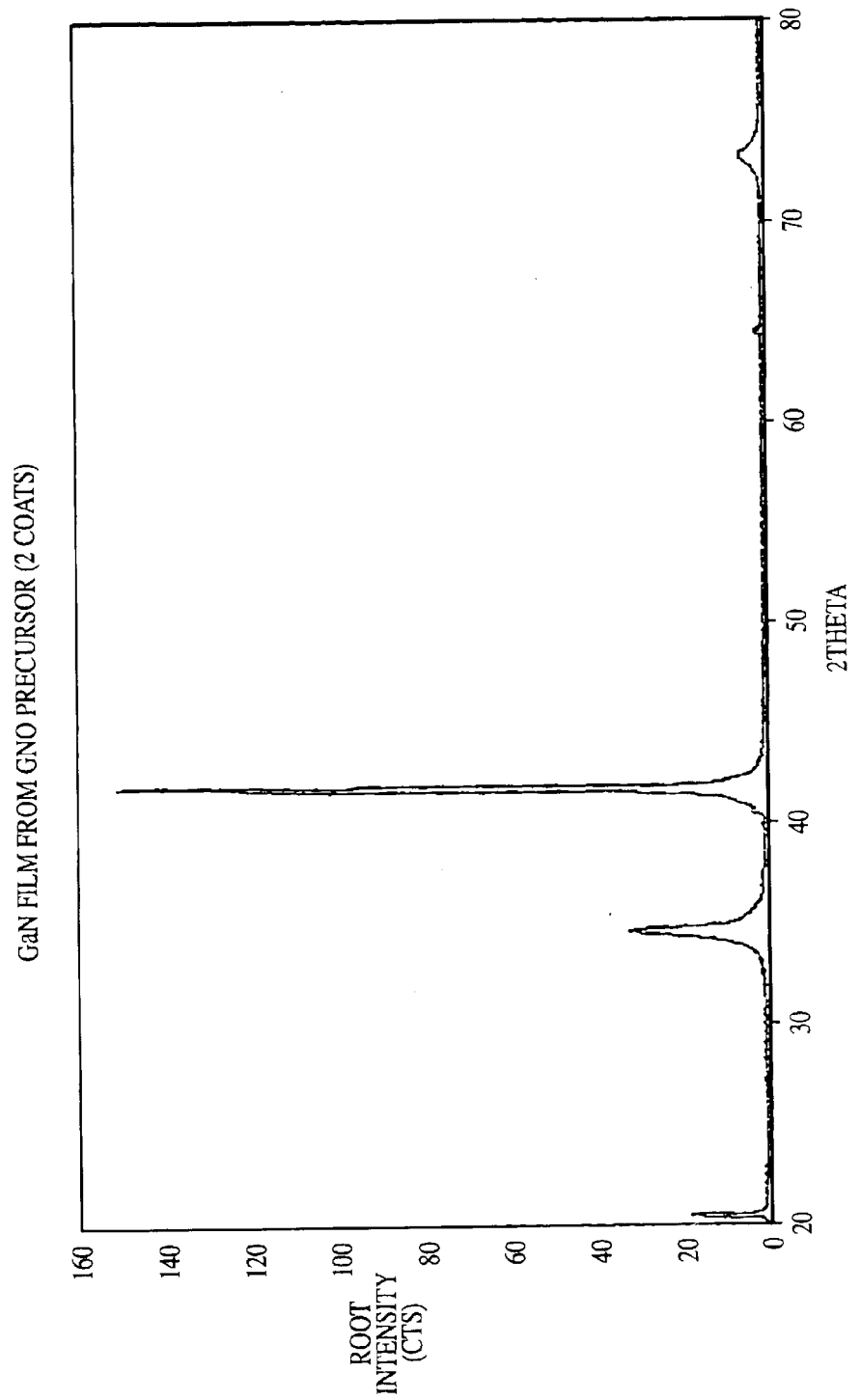
FIG. 26 shows the results of a 2 theta-omega scan of twice coated GaN film from gallium nitrate precursor.

The surfaces of GNO based films were also studied. FIG. 24 (GNO based) shows that the substrate is partially coated with islands of GaN. Loose, non-epitaxial grains (~100 nm in diameter) are also scattered on the surface of the film. A second coating of GNO was applied to try to get an increase in coverage. FIGS. 25 and 26 show the surface image (SEM) and XRD scan of this twice coated film (FIG. 19A is the same film, once coated). In the twice-coated film, the coverage increases on the surface probably due to nucleation of film on the islands of GaN from the first deposition.

Figure 27A:
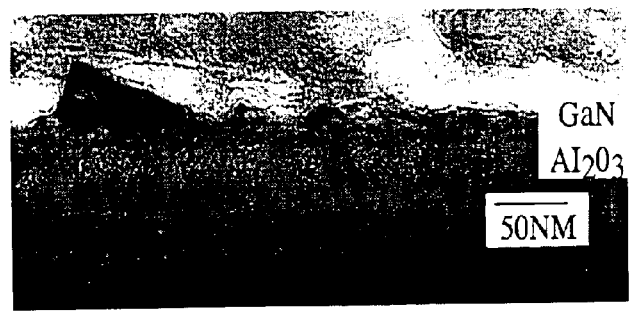
FIG. 27(a) shows a typical cross-sectional micrograph (bright field) of GaN on r-plane sapphire.
Figure 27B:
FIGS. 27(b) and (c) show a dark field image and SAD pattern of the film and sapphire, respectively.
Figure 27C:
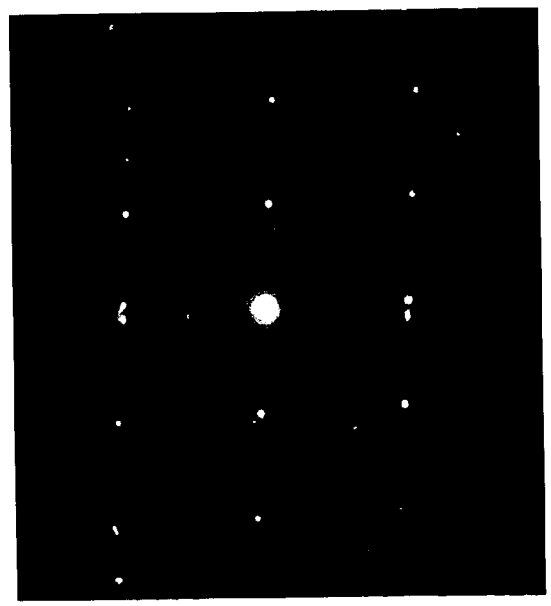

Cross-sectional TEM specimens were prepared by a mechanical thinning method (dimpling method) described in a paper by Strecker. *Strecker*. Specimens were then ion milled (Model 691, Gatan Inc., Pleasanton, Calif.) until they were electron transparent. Cross sectional TEM analysis (JEOL-2000, Japan) was done using an accelerating voltage of 200 keV. FIG. 27(*a*) shows a typical cross-sectional micrograph (bright field) of GaN on r-plane sapphire. The sample was prepared from a 0.2M solution of GNO coated at 3000 rpm for 60 seconds. The film was heated in ammonia to 1000° C. for 60 minutes. The film appears to be continuous with flat regions of about 20 nm with larger (50–75 nm) saw tooth shaped grains growing out of the 20 nm layer. SAD was used to determine the crystalline orientations of the film and substrate as well as the epitaxial relationship between GaN and sapphire. FIGS. 27(*b*) and 27(*c*) show a dark field image and SAD pattern of the film and sapphire, respectively. The SAD image shows that the GaN layer is epitaxial to sapphire with the following orientations: GaN (0001)//$Al_2O_3$ (0001) and GaN (11–20)//$Al_2O_3$ (01–12). FIG. 27(*b*) shows the epitaxial grains growing from the interface.

Figure 28:
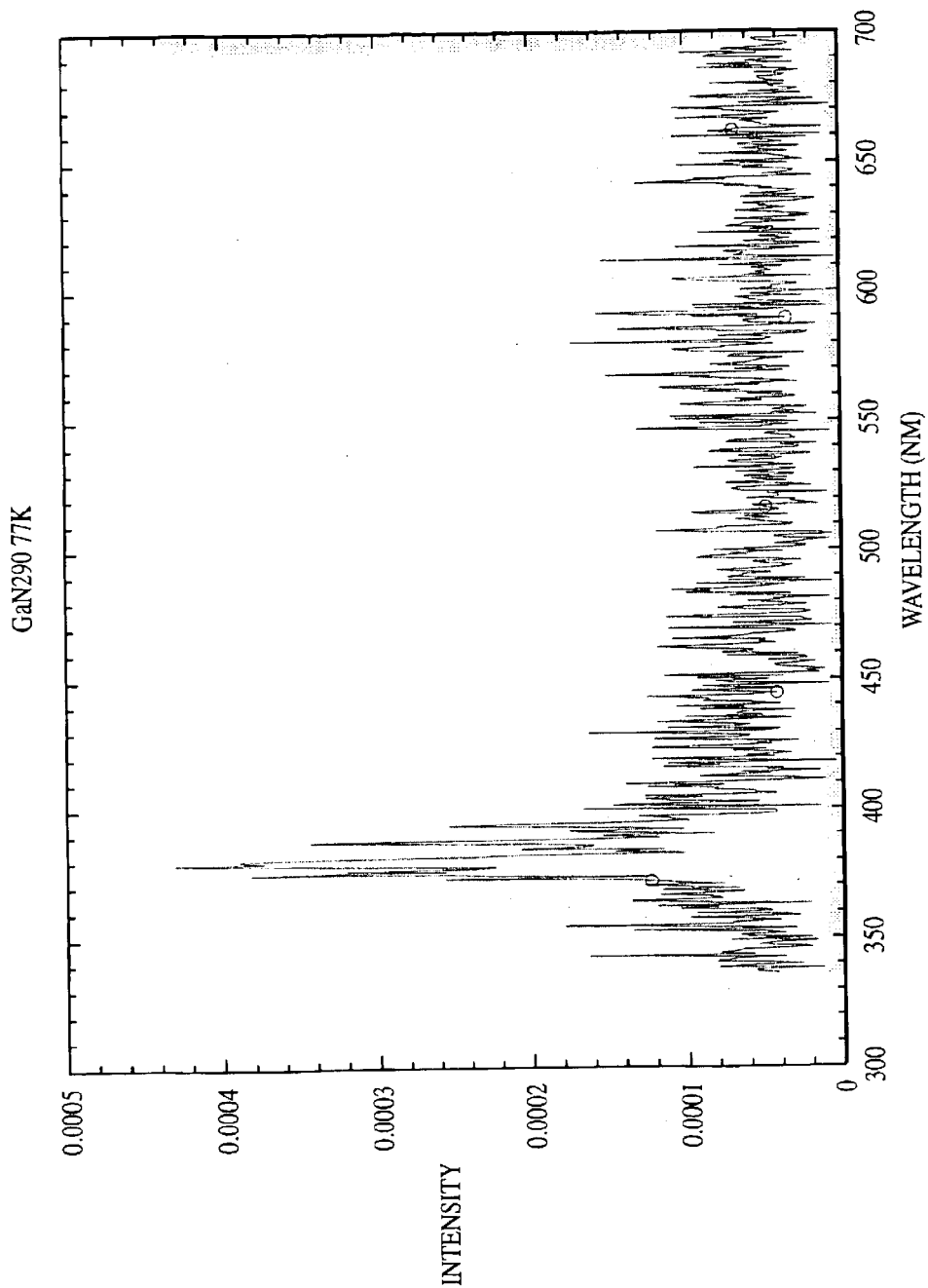
FIG. 28 shows photoluminescence data of gallium nitrate based GaN films determined at 77° K.

Pure, undoped GaN luminesces at 365 nm, which is equivalent to its 3.45 eV band gap. FIG. 28 shows photoluminescence data of GNO based GaN films determined at 77K where the emission of light occurs at approximately 380 nm, which is in the violet range. The shift in the peak is most likely due to a carbon and oxygen acceptor-donor states within the band gap. Furthermore, the intensity of the peak is approximately 10% of a 2 $\mu$m GaN film made from MOCVD. The intensities are comparable, since GaN films made in this Example are 50 nm thick. Thicker films of GaN should produce more intensity in PL studies.

Although the present invention and its advantages have been described in detail, it should be understood that various changes, substitutions and alterations can be made herein without departing from the spirit and scope of the invention. Moreover, the scope of the present application is not intended to be limited to the particular embodiments of the process, machine, manufacture, composition of matter, means, methods and/or steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the invention is intended to include within its scope such processes, machines, manufacture, compositions of matter, means, methods, or steps.

We claim:

1. A process for producing crystalline III-V compound films on crystal substrates, the process comprising the steps of:
    (a) depositing an amorphous layer of gallium dimethyl amide on a crystal substrate;
    (b) reacting the amorphous layer with a reduced form of a Group V element; and (c) after the reacting step, heating the amorphous layer at a temperature and for a time sufficient to crystallize said amorphous layer by pyrolysis.

2. The process of claim 1, in which the reacting step comprises reacting the amorphous layer with $NH_3$ so that carbon groups are removed from gallium dimethyl amide.

3. The process of claim 1, in which the heating step comprises heating the amorphous layer in a $N_2$ or $NH_3$ atmosphere.

4. The process of claim 1, in which the heating step comprises heating the amorphous layer at a temperature preferably between 900° C.–1100° C.

5. The process of claim 1, in which the crystal substrate is a single crystal substrate selected from the group consisting of C-plane (0001) $Al_2O_3$, r-plane (01–12) $Al_2O_3$, r-plane $Al_2O_3$, (001) $LiGaO_2$ and (100) $LiAlO_2$.

6. The process of claim 1, in which the crystal substrate is C-plane (0001) $Al_2O_3$.

7. The process of claim 1, in which the crystal substrate is r-plane (01–12) $Al_2O_3$.

8. A process for producing crystalline III-V compound films on crystal substrates, the process comprising the steps of:

(a) depositing an amorphous layer of an oxygen-containing gallium salt on a crystal substrate;

(b) reacting the amorphous layer with a reduced form of a Group V element; and (c) after the reacting step, heating the amorphous layer at a temperature and for a time sufficient to crystallize said amorphous layer by pyrolysis.

9. The process of claim 8, in which the oxygen-containing gallium salt is gallium nitrate.

10. A process for producing crystalline III-V compound films on crystal substrates, the process comprising the steps of:

(a) depositing an amorphous layer of an oxygen-containing gallium alkoxide on a crystal substrate;

(b) reacting the amorphous layer with a reduced form of a Group V element; and (c) after the reacting step, heating the amorphous layer at a temperature and for a time sufficient to crystallize said amorphous layer by pyrolysis.

11. The process of claim 10, in which the oxygen-containing gallium alkoxide is gallium isopropoxide.

12. The process of claim 9 or 11, in which the crystal substrate is a single crystal substrate selected from the group consisting of C-plane (0001) $Al_2O_3$, r-plane (01–12) $Al_2O_3$, r-plane $Al_2O_3$, and SiC.

13. The process of claim 9 or 11, in which the crystal substrate is C-plane (0001) $Al_2O_3$.

14. The process of claim 9 or 11, in which the crystal substrate is (01–12) $Al_2O_3$.

15. The process of claim 9 or 11, in which the heating step comprises heating the amorphous layer in an $NH_3$ atmosphere.

16. The process of claim 9 or 11, in which the heating step comprises heating the amorphous layer at a temperature preferably between 900° C.–1100° C.

17. The process of claim 9 or 11, in which the reacting step and the heating step are carried out simultaneously.

18. A process for producing crystalline gallium nitride thin films on a crystal substrate, the process comprising the steps of:

(a) depositing an amorphous layer of gallium dimethyl amide by spin coating a solution of gallium dimethyl amide on a single crystal substrate;

(b) reacting the amorphous layer with $NH_3$ so that carbon groups are removed from the amorphous layer of gallium dimethyl amide; and (c) after the reacting step, heating the amorphous layer in a $N_2$ or $NH_3$ atmosphere at a temperature and for a time sufficient to crystallize the amorphous layer by pyrolysis.

19. A process for producing crystalline gallium nitride thin films on a crystal substrate, the process comprising the steps of:

(a) depositing an amorphous layer of a gallium nitride precursor by spin coating a solution of gallium nitrate or gallium isopropoxide on a single crystal substrate;

(b) reacting the amorphous layer with $NH_3$ so that the amorphous layer is reduced and subject to nitridation; and (c) simultaneously with the reacting step, heating the amorphous layer in an $NH_3$ atmosphere at a temperature and for a time sufficient to crystallize the amorphous layer by pyrolysis.

20. A process for producing crystalline III-V compound films on crystal substrates, the process comprising the steps of:

(a) depositing an amorphous layer of a Group III-dimethyl amide on a crystal substrate;

(b) reacting the amorphous layer with a reduced form of a Group V element; and (c) after the reacting step, heating the amorphous layer at a temperature and for a time sufficient to crystallize said amorphous layer by pyrolysis.

21. A process for producing crystalline III-V compound films on crystal substrates, the process comprising the steps of:

(a) depositing an amorphous layer of an oxygen-containing Group III salt on a crystal substrate;

(b) reacting the amorphous layer with a reduced form of a Group V element; and (c) after the reacting step, heating the amorphous layer at a temperature and for a time sufficient to crystallize said amorphous layer by pyrolysis.

22. A process for producing crystalline III-V compound films on crystal substrates, the process comprising the steps of:

(a) depositing an amorphous layer of an oxygen-containing Group III alkoxide on a crystal substrate;

(b) reacting the amorphous layer with a reduced form of a Group V element; and (c) after the reacting step, heating the amorphous layer at a temperature and for a time sufficient to crystallize said amorphous layer by pyrolysis.

* * * * *